US008699116B2

(12) United States Patent  (10) Patent No.: US 8,699,116 B2
Suzuki et al. (45) Date of Patent: Apr. 15, 2014

(54) MICROACTUATOR, OPTICAL DEVICE, DISPLAY APPARATUS, EXPOSURE APPARATUS, AND METHOD FOR PRODUCING DEVICE

(75) Inventors: Junji Suzuki, Tama (JP); Soichi Owa, Kumagaya (JP)

(73) Assignee: Nikon Corporation, Tokyo (JP)

( * ) Notice: Subject to any disclaimer, the term of this patent is extended or adjusted under 35 U.S.C. 154(b) by 503 days.

(21) Appl. No.: 12/662,719

(22) Filed: Apr. 29, 2010

(65) Prior Publication Data

US 2010/0253925 A1  Oct. 7, 2010

Related U.S. Application Data

(63) Continuation of application No. PCT/JP2008/070223, filed on Nov. 6, 2008.

(30) Foreign Application Priority Data

Nov. 9, 2007  (JP) ................................. 2007-291790

(51) Int. Cl.
G02B 26/00  (2006.01)

(52) U.S. Cl.
USPC .......................................................... 359/291

(58) Field of Classification Search
USPC ......... 359/290–293, 295, 223, 224, 237, 320, 359/324; 310/309
See application file for complete search history.

(56) References Cited

U.S. PATENT DOCUMENTS

| 5,285,196 | A | 2/1994 | Gale, Jr. |
| 5,835,256 | A | 11/1998 | Huibers |
| 6,046,840 | A | 4/2000 | Huibers |
| 6,172,797 | B1 | 1/2001 | Huibers |
| 6,737,662 | B2 | 5/2004 | Mulder et al. |
| 7,023,610 | B2 | 4/2006 | Ohtsuki et al. |
| 7,098,993 | B2 | 8/2006 | Fujii et al. |

(Continued)

FOREIGN PATENT DOCUMENTS

| JP | 2002-351086 | 12/2002 |
| JP | 2002-353105 | 12/2002 |

(Continued)

OTHER PUBLICATIONS

Kyu-Ho Hwang et al., "Design and Fabrication of the Thin-Film Micromirror Array-actuated for Large Projection Displays," Journal of the Korean Physical Society, vol. 33, Nov. 1998, pp. S467S-470.

(Continued)

Primary Examiner — Tuyen Tra

(57) ABSTRACT

A microactuator includes a base member, a plate-shaped member which is deflectively deformable, and a driving force applying device. A driving objective is connected to a predetermined portion of a deflectively deformable area of the plate-shaped member. The driving force applying device deflectively deforms the deflectively deformable area to change an inclination of the predetermined portion of the plate-shaped member between a first inclination and a second inclination; and a part of the plate-shaped member or a part of a member fixed to the plate-shaped member is brought into abutment against a member when the inclination is the first inclination, and the part of the plate-shaped member or the part of the member fixed to the plate-shaped member is brought into abutment against the base member when the inclination is the second inclination.

37 Claims, 29 Drawing Sheets

(56) References Cited

U.S. PATENT DOCUMENTS

| | | | |
|---|---|---|---|
| 7,116,463 B2 * | 10/2006 | Wu et al. | 359/291 |
| 7,242,456 B2 * | 7/2007 | Ryzhikov et al. | 355/55 |
| 7,385,747 B2 * | 6/2008 | Dewald et al. | 359/237 |
| 7,944,599 B2 * | 5/2011 | Chui et al. | 359/290 |
| 2003/0068118 A1 | 4/2003 | Bourgeois et al. | |
| 2003/0155995 A1 | 8/2003 | Iwata et al. | |
| 2004/0207287 A1 | 10/2004 | Akagawa | |
| 2005/0280975 A1 | 12/2005 | Iwata et al. | |
| 2006/0066964 A1 | 3/2006 | Greywall | |

FOREIGN PATENT DOCUMENTS

| | | |
|---|---|---|
| JP | 2003-29176 | 1/2003 |
| JP | 2003-242873 | 8/2003 |
| JP | 3492400 | 11/2003 |
| JP | 2004-71481 | 3/2004 |
| JP | 2004-184564 | 7/2004 |
| JP | 2005-24966 | 1/2005 |
| JP | 2005-504355 | 2/2005 |
| JP | 2005-175177 | 6/2005 |
| JP | 2006-102934 | 4/2006 |
| JP | 2006-178447 | 7/2006 |
| JP | 2007-17769 | 1/2007 |
| JP | 2007-192902 | 8/2007 |
| JP | 2007-287468 | 11/2007 |
| JP | 2007-312553 | 11/2007 |
| WO | WO 99/46835 | 9/1999 |

OTHER PUBLICATIONS

International Search Report for PCT/JP2008/070223, mailed on Jan. 20, 2009.

Korean Notice of Preliminary Rejection issued Dec. 5, 2012 in corresponding Korean Patent Application No. 10-2008-7021153.

PCT Form PCT/ISA/237 for PCT/JP2008/070223 issued Jun. 11, 2008.

Japanese Notice of Reasons for Rejection issued Nov. 30, 2012 in corresponding Japanese Patent Application No. 2009-540083.

Japanese Office Action mailed Jul. 30, 2013 in corresponding Japanese Application No. 2009-540083.

* cited by examiner

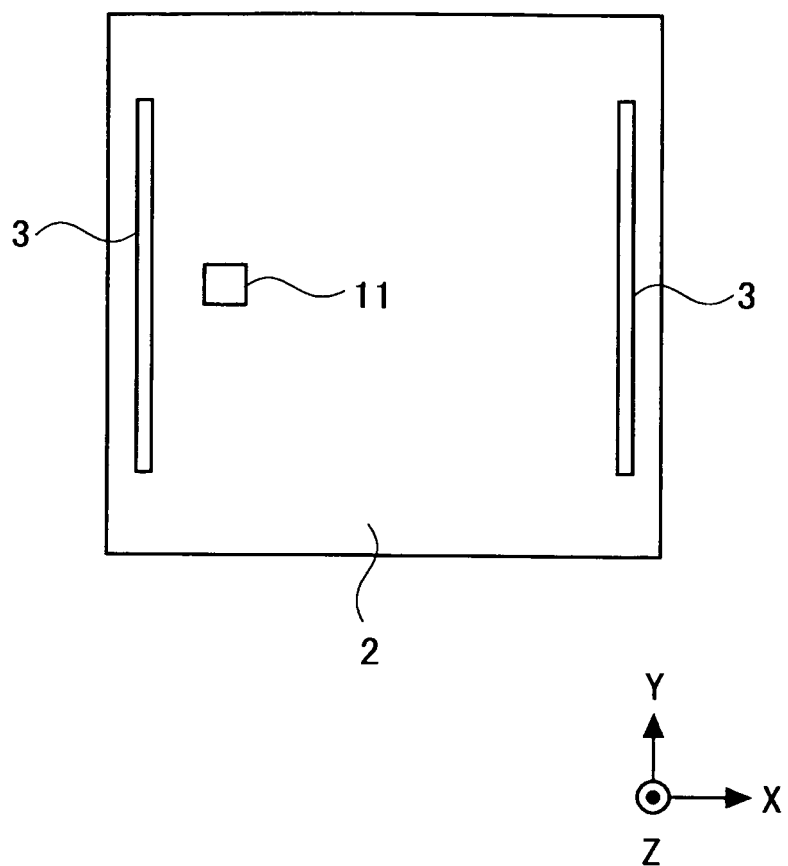

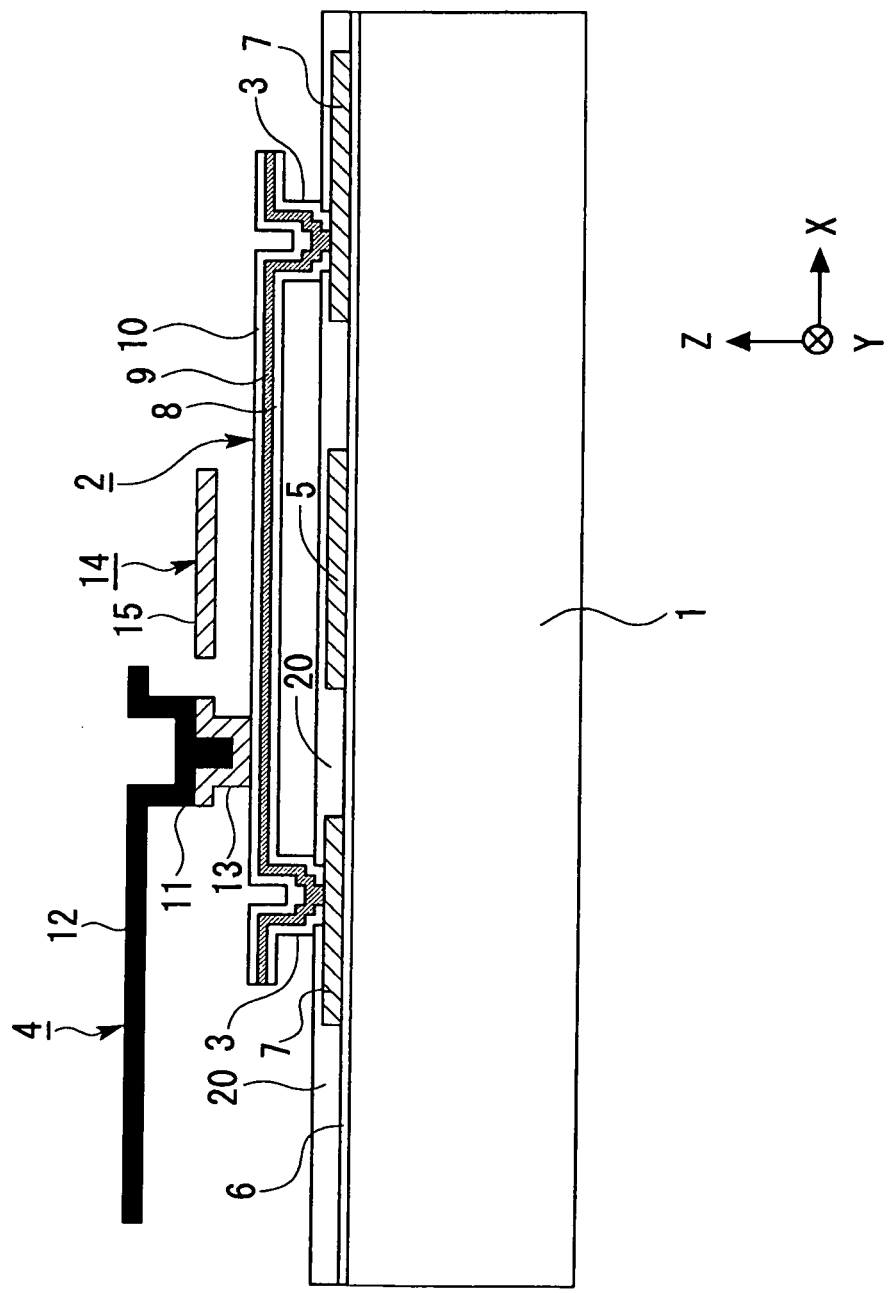

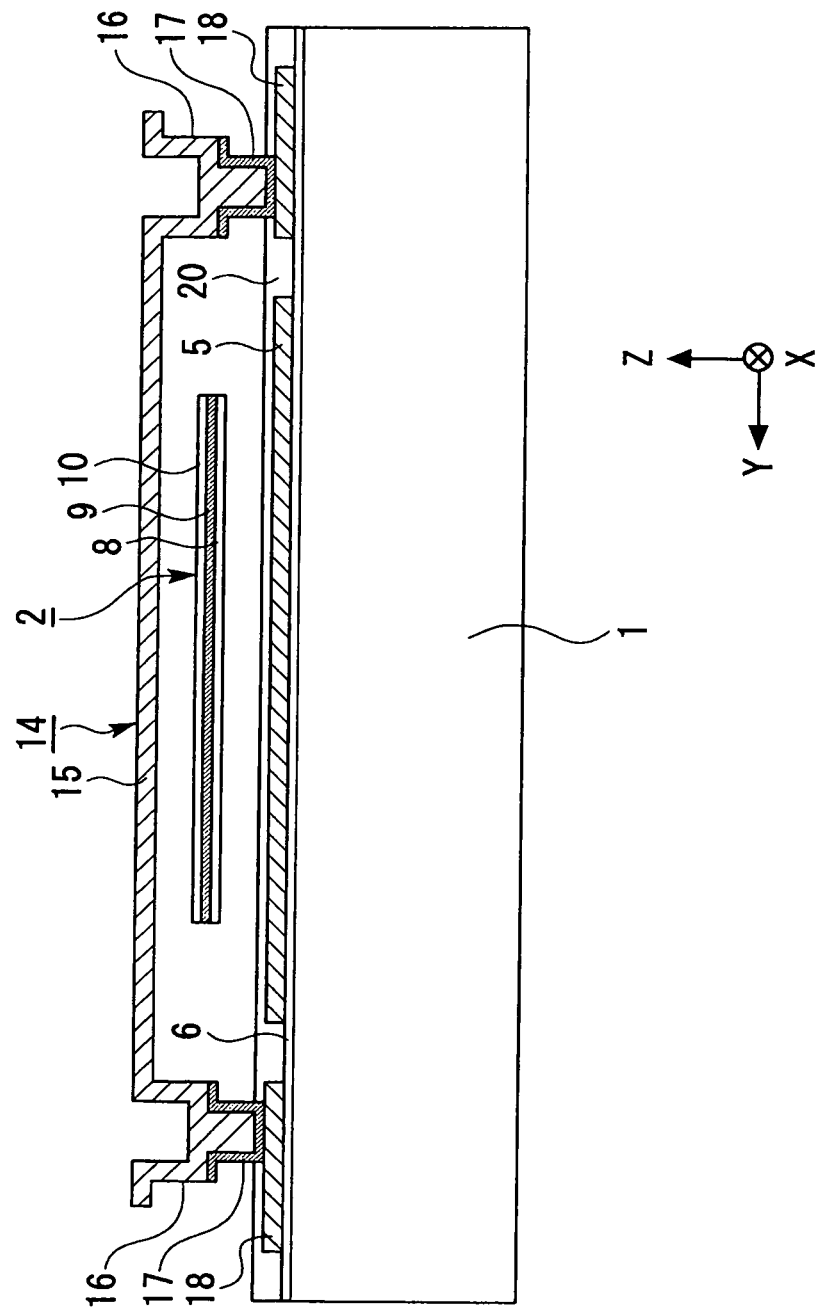

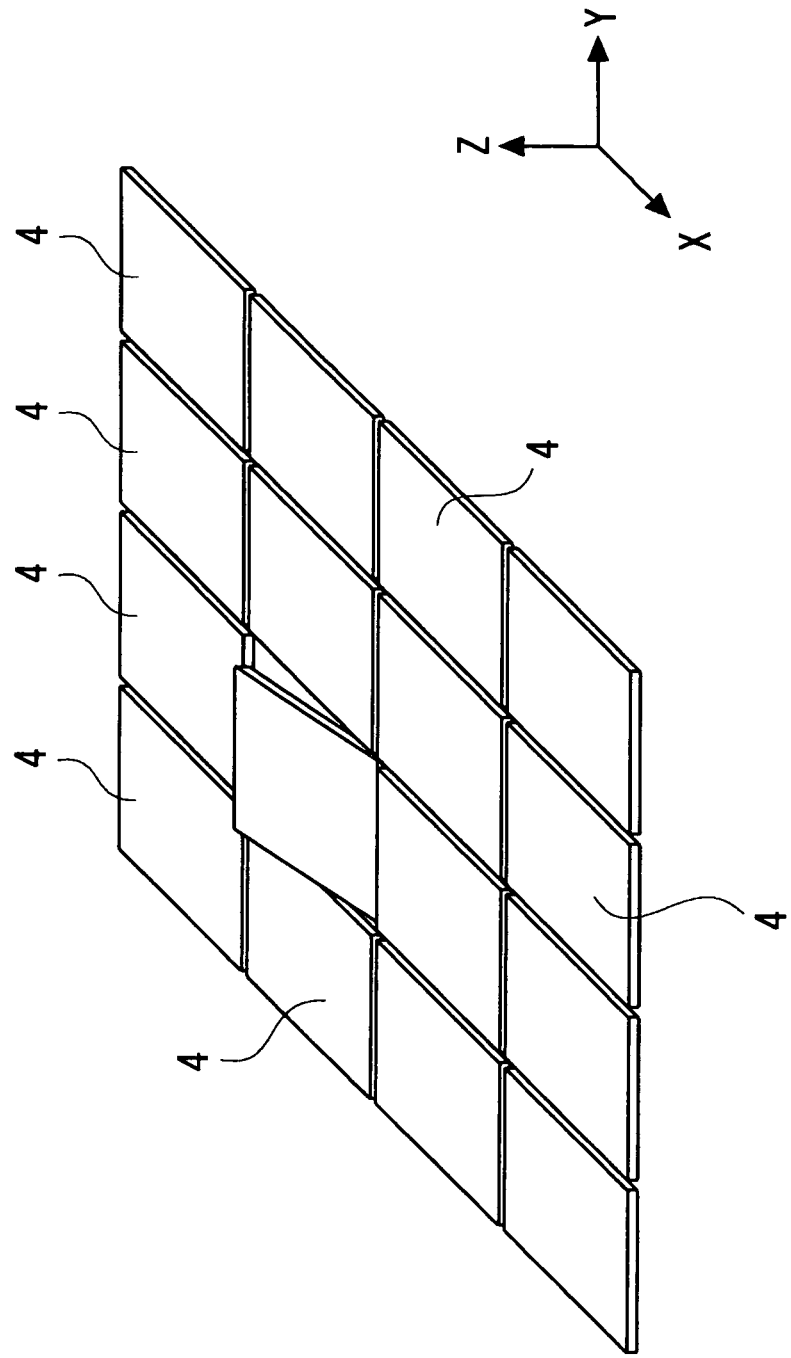

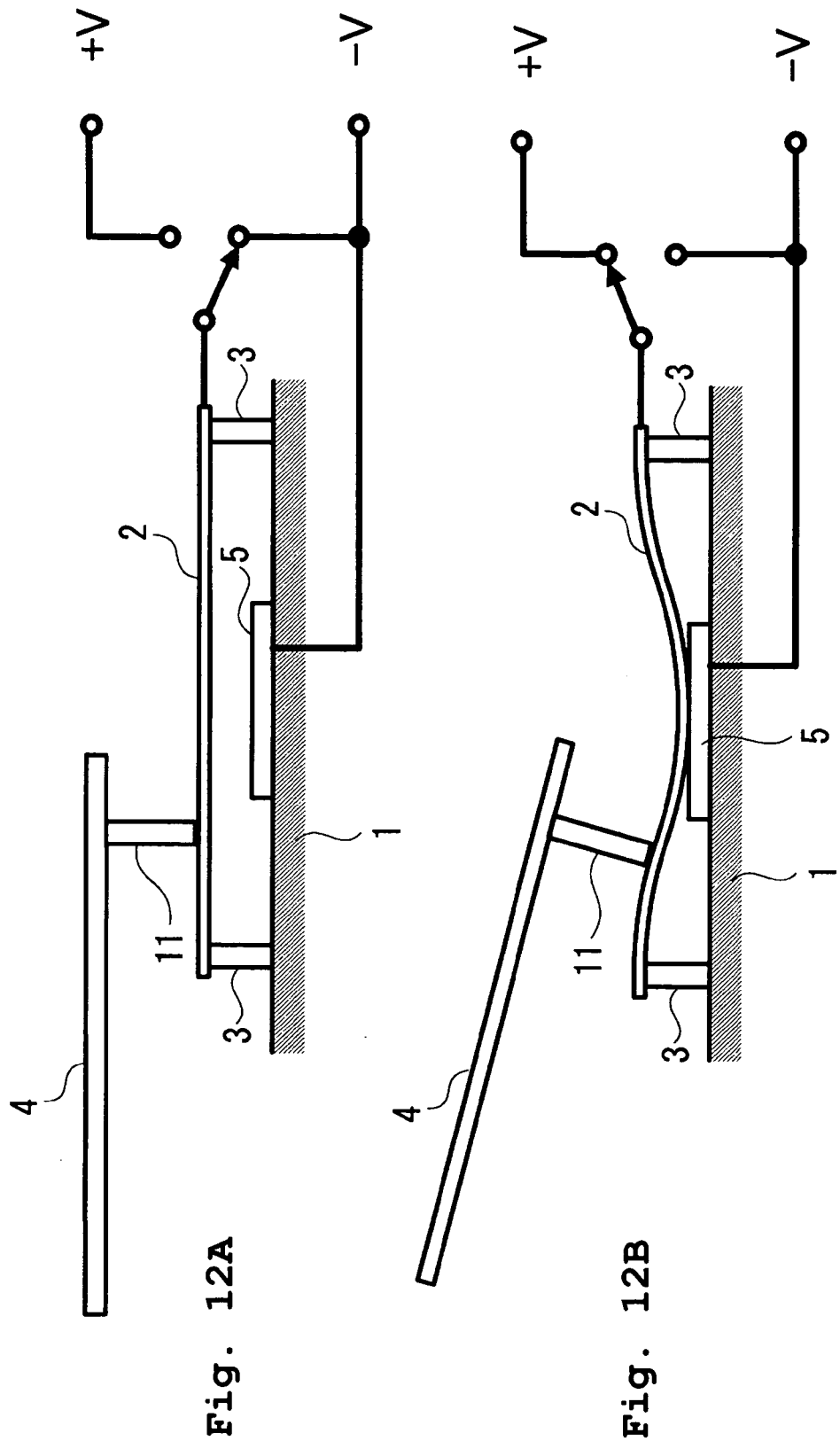

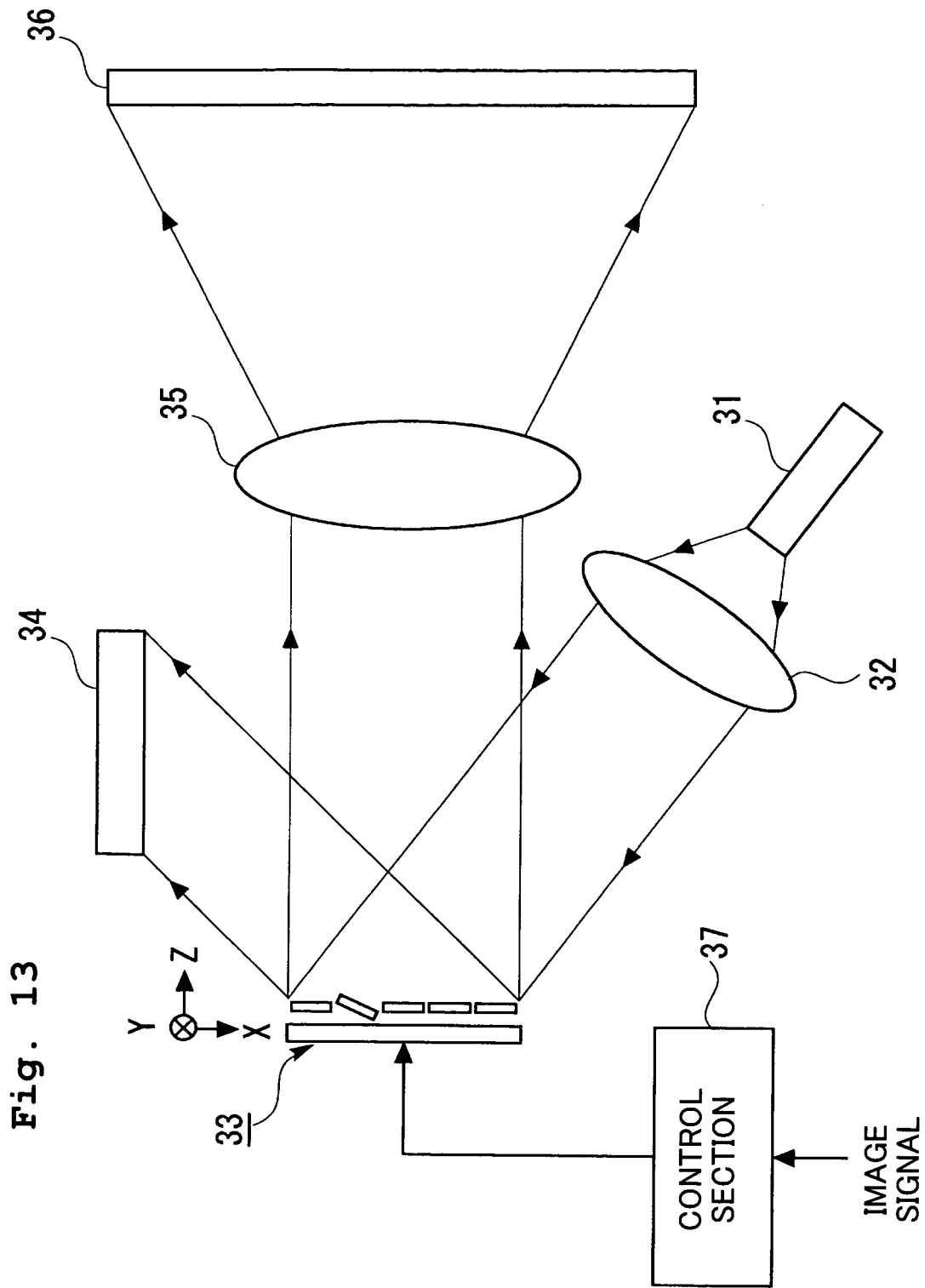

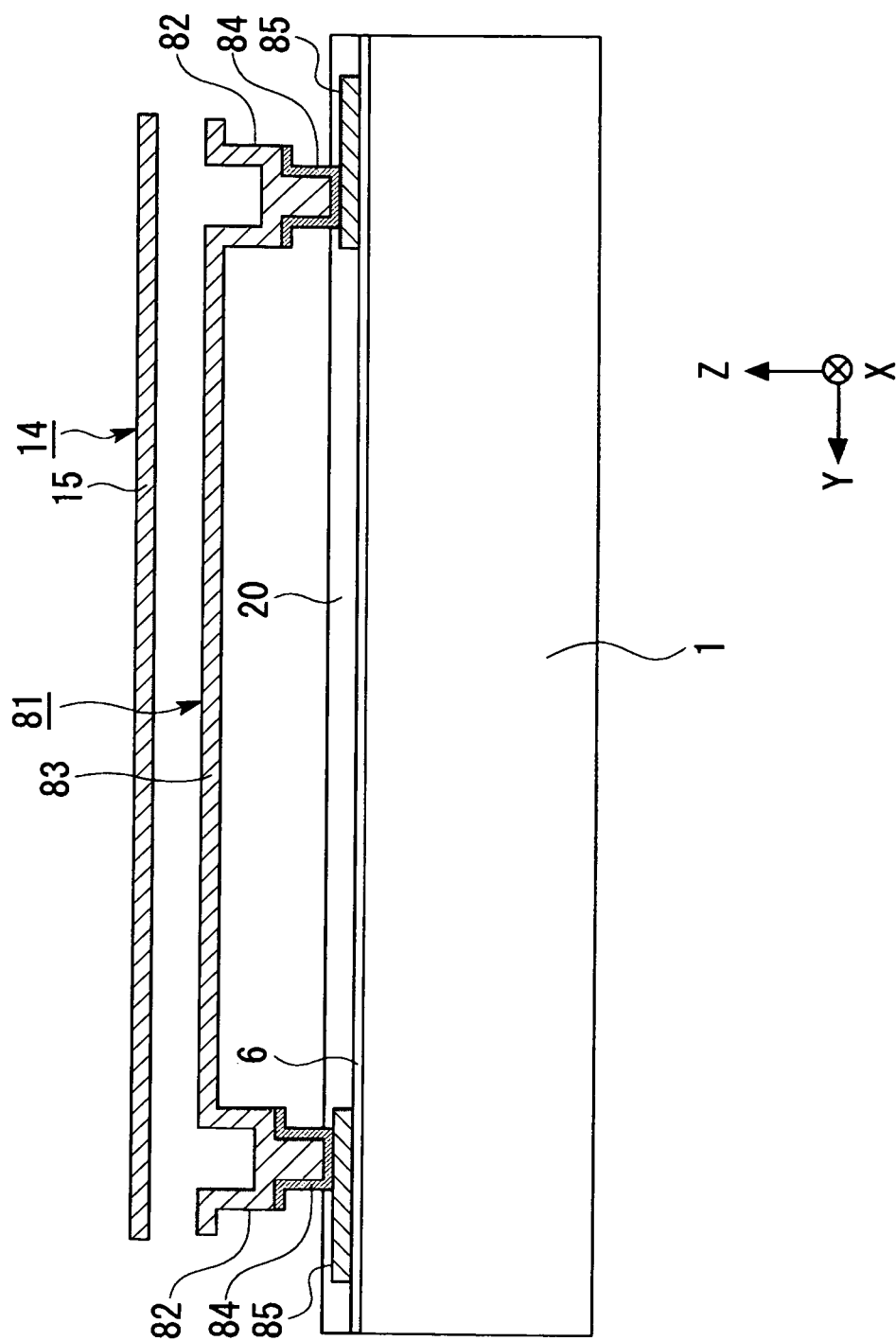

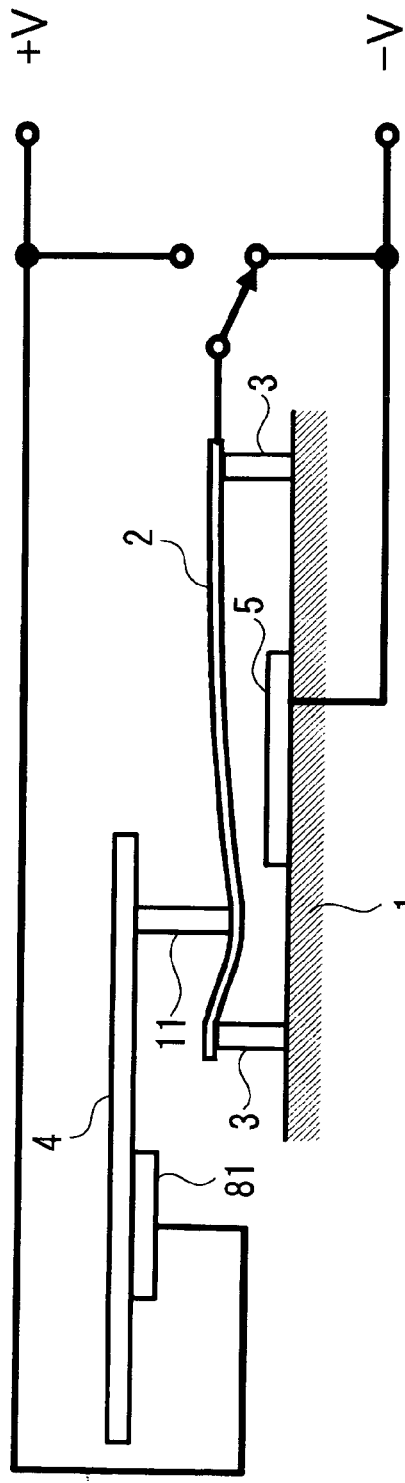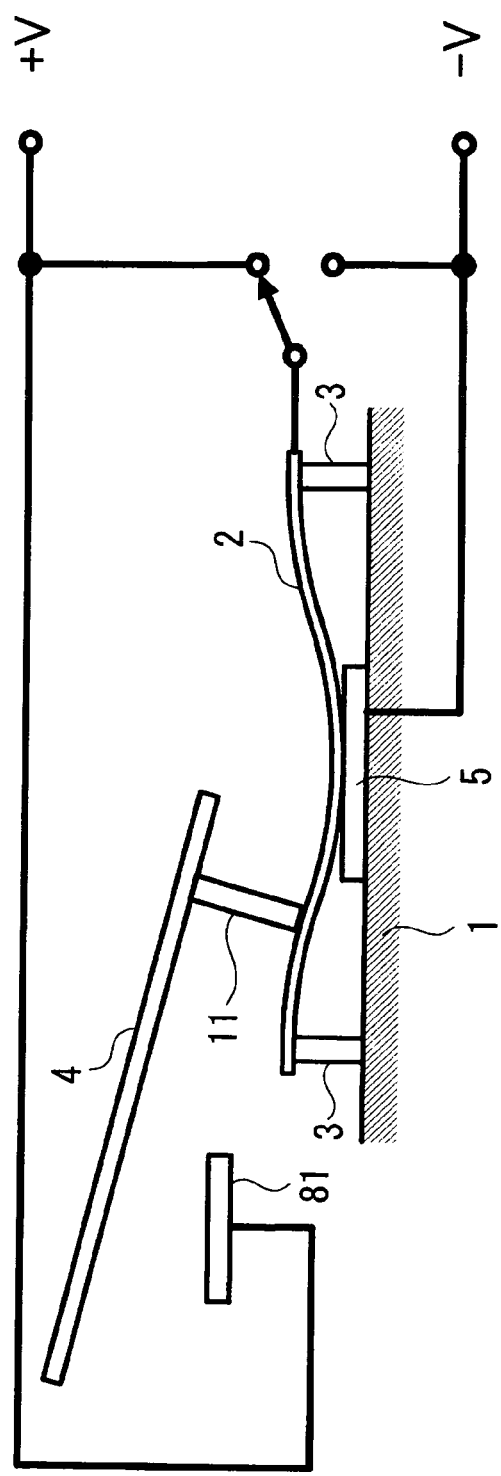

MICROACTUATOR, OPTICAL DEVICE, DISPLAY APPARATUS, EXPOSURE APPARATUS, AND METHOD FOR PRODUCING DEVICE

CROSS-REFERENCES TO RELATED APPLICATIONS

This application is a Continuation Application of International Application No. PCT/JP2008/070223 which was filed on Nov. 6, 2008 claiming the conventional priority of Japanese patent Application No. 2007-291790 filed on Nov. 9, 2007.

BACKGROUND

1. Field

The present invention relates to a microactuator, an optical device, a display apparatus, an exposure apparatus, and a method for producing a device.

2. Description of the Related Art

In accordance with the development of the MEMS (Micro-Electro-Mechanical System) technique, various microactuators to which the technique is applied, various optical devices such as DMD (Digital Micro-mirror Device) and the like which utilize the technique, various projection display apparatuses which utilize such optical devices, various exposure apparatuses which use such optical devices as variable shaped masks (also referred to as "active masks"), etc. have been suggested.

For example, Japanese Patent No. 3492400 discloses a typical DMD. In this DMD, a mirror is held by a torsion hinge, and the hinge is torsionally deformed by the electrostatic force to rotate the mirror so that the direction of the mirror is changed to change the direction of reflection of the incident light (incident light beam). A plurality of the basic units as described above are aligned one-dimensionally or two-dimensionally to provide a spatial optical modulator which is applied to an optical information processing apparatus, a projection display apparatus, an electrostatic photograph printing apparatus, etc.

An optical device is also known, in which a cantilever beam provided with a mirror is deflected or flexibly bent by the electrostatic force to change the direction of reflection of the incident light (see "Design and Fabrication of the Thin-Film Micromirror Array-actuated for Large Projection Displays (Journal of the Korean Physical Society, Vol. 33, No., November 1998, pp. S467-S470)").

However, in the microactuator using the torsion hinge, the mirror is held by the torsion hinge. Therefore, the microactuator tends to be damaged or broken by the torsional stress applied to a connecting portion of the torsion hinge, and it has been difficult to prolong the service life thereof. On the other hand, in the microactuator using the cantilever beam, it has been impossible to quicken the response speed, because the natural frequency of the cantilever beam is low.

In view of the above, Japanese Patent Application Laid-open No. 2005-24966 proposes a micromirror device using a bridge beam which has both ends fixed onto a substrate having a V-shaped recess and which is provided to bridge the recess. In this device, a light-reflective film is formed on the bridge beam, and a mirror is integrated with the bridge beam as a whole. In a state in which the electrostatic force is not applied, the bridge beam (i.e., the mirror) has a flat plate-shaped form. On the other hand, when the electrostatic force is applied, the bridge beam (i.e., the mirror) is deformed to have a V-shaped form along with the V-shaped recess in accordance with the electrostatic force to change the direction of reflection of the incident light.

Since this device uses the beam, the damage or breakage hardly occurs and it is possible to realize a long service life as compared with a case in which the torsion hinge is used. Further, it is possible to enhance the natural frequency, and it is possible to quicken the response speed.

SUMMARY

However, in the device disclosed in Japanese Patent Application Laid-open No. 2005-24966, the mirror is integrated with the bridge beam. Therefore, when the bridge beam is deformed into the V-shaped form by the electrostatic force, the mirror is also deformed into the V-shaped form; and the reflecting surface of the mirror provides two surfaces having different directions (one surface and the other surface brought about by the V-shaped form). As a result, the direction of reflected light (reflected light beam) greatly differs depending on the position at which the incident light comes; and thus any stray light, etc. tends to arise, and it is difficult to perform, for example, light-absorbing process for the stray light.

As described above, although the device which is disclosed in Japanese Patent Application Laid-open No. 2005-24966 is extremely excellent in the realization of the long service life and the realization of the high response speed, the mirror which is the driving objective is integrated with the bridge beam, and hence the mirror as the driving objective is also deformed, which in turn causes the inconvenience such as the stray light or the like arises as described above, as a result.

It is sometimes requested to change only the direction of the driving objective without deforming the driving objective itself not only in the microactuator which is to be used for the mirror device as disclosed in Japanese Patent Application Laid-open No. 2005-24966 but also in any microactuator which is to be used in other various ways of use.

Further, in order to realize the higher driving speed of the microactuator as described above, it is preferable that a time (settling time or statically determinate time), which elapses until the vibration upon the driving is attenuated to be static or stationary (settled), is short.

The present invention has been made taking the foregoing circumstances into consideration, an object of which is to provide a microactuator in which it is possible to realize a long service life and a high response speed, it is possible to change only the direction of a driving objective without deforming the driving objective itself, and it is possible to shorten the settling time so that the driving can be performed at a higher speed. Another object of the present invention is to provide an optical device which uses such a microactuator, a display apparatus, an exposure apparatus, and a method for producing a device which uses such an exposure method.

In order to achieve the objects as described above, according to a first aspect of the embodiment of the present invention, there is provided a microactuator which drives a driving objective, the microactuator comprising: a base member; a plate-shaped member which is deflectively deformable and which is supported by the base member; and a driving force applying device which applies a driving force to the driving objective; wherein the plate-shaped member is fixed to the base member at a predetermined place and the plate-shaped member is deflectively deformable in a deflectively deformable area which is different from the predetermined place of the plate-shaped member; the driving objective is connected to a predetermined portion of the deflectively deformable area of the plate-shaped member; the driving force applying device deflectively deforms the deflectively deformable area of the plate-shaped member to change an inclination of the predetermined portion of the plate-shaped member between a first inclination and a second inclination; and a part of the plate-shaped member or a part of a member fixed to the plate-shaped member is brought into abutment against a member which is different from the base member when the inclination of the predetermined portion is the first inclination, and the part of the plate-shaped member or the part of the member fixed to the plate-shaped member is brought into abutment against the base member when the inclination of the predetermined portion is the second inclination. In the microactuator, the plate-shaped member may be fixed to the base member at the predetermined place located on an entire circumference or a part of the circumference at a circumferential portion of the plate-shaped member and the plate-shaped member may be deflectively deformable in the deflectively deformable area different from the predetermined place of the plate-shaped member. The predetermined place may include mutually opposing two places at the circumferential portion of the plate-shaped member. The driving objective may be mechanically connected locally to the predetermined portion of the plate-shaped member; and the member, which is different from the base member, may be a member which is fixed to the base member or a position-changeable member which is provided displaceably with respect to the base member. As in a sixth embodiment described later on, the position-changeable member may be the driving objective.

In the microactuator, the driving objective may have a principal plane, and a principal plane of the plate-shaped member may be substantially parallel to the principal plane of the driving objective.

In the microactuator, the predetermined portion of the plate-shaped member may be a portion which is disposed eccentrically from a center of gravity of the plate-shaped member.

In the microactuator, the driving force applying device may include a first electrode portion which is provided on the plate-shaped member, a second electrode portion which is arranged on one side of the first electrode portion and which generates an electrostatic force between the first electrode portion and the second electrode portion by a voltage between the first electrode portion and the second electrode portion, and a third electrode portion which is arranged on the other side of the first electrode portion and which generates an electrostatic force between the first electrode portion and the third electrode portion by a voltage between the first electrode portion and the third electrode portion; the second electrode portion may be provided on the base member; and the third electrode portion may be provided on the member which is fixed to the base member.

In the microactuator, the part of the plate-shaped member may be brought into abutment against the position-changeable member when the inclination of the predetermined portion is the first inclination; the driving force applying device may include a first electrode portion which is provided on the plate-shaped member, a second electrode portion which is arranged on one side of the first electrode portion and which generates an electrostatic force between the first electrode portion and the second electrode portion by a voltage between the first electrode portion and the second electrode portion, and a third electrode portion which is arranged on the other side of the first electrode portion and which generates an electrostatic force between the first electrode portion and the third electrode portion by a voltage between the first electrode portion and the third electrode portion; the second electrode portion may be provided on the base member; the third electrode portion may be provided on the position-changeable member; and the microactuator may further comprise a positioning mechanism which changes a position of the position-changeable member to a predetermined position from a position different from the predetermined position and which positions the position-changeable member at the predetermined position.

In the microactuator, the driving objective may have a principal plane; and the principal plane of the driving objective may be substantially parallel to a principal plane of the base member when the inclination of the predetermined portion is the first inclination.

In the microactuator, the positioning mechanism may include a deflectable member which is supported by the base member, a fourth electrode portion which is provided on the deflectable member, and a fifth electrode portion which is provided on the base member and which generates an electrostatic force between the fourth electrode portion and the fifth electrode portion by a voltage between the fourth electrode portion and the fifth electrode portion.

In the microactuator, the driving force applying device may include a first electrode portion which is provided on the plate-shaped member, a second electrode portion which is provided on the base member and which generates an electrostatic force between the first electrode portion and the second electrode portion by a voltage between the first electrode portion and the second electrode portion, and a third electrode portion; the driving objective may have a fourth electrode portion; and the third electrode portion may generate an electrostatic force between the third electrode portion and the fourth electrode portion by a voltage between the third electrode portion and the fourth electrode portion.

An optical device according to the embodiment of the present invention comprises the microactuator as defined above and the driving objective, wherein the driving objective may be an optical element.

In the optical device, the optical element may be a mirror.

The optical device may comprise a plurality of sets of the microactuator and the optical element.

According to a second aspect of the embodiment of the present invention, there is provided an optical device comprising a base member; a flexible plate which is supported on the base member deflectively deformably; an optical element which is connected to the flexible plate; a first electrode which is provided on the flexible plate; a second electrode which is provided on the base member; a third electrode which is provided at a position different from those of the base member and the flexible plate; and a constraint member which constrains displacement of the optical element or the flexible plate; wherein when a voltage is applied between the first electrode and the second electrode to generate an electrostatic force between the first electrode and the second electrode, the flexible plate is deflected toward the base member and the flexible plate is constrained by the base member so that the optical element is arranged at a second angle by the electrostatic force generated between the first electrode and the second electrode, and when a voltage is applied between the second electrode and the third electrode to generate an electrostatic force between the second electrode and the third electrode, the optical element or the flexible plate is constrained by the constraint member so that the optical element is arranged at a first angle by the electrostatic force generated between the second electrode and the third electrode.

In the optical device, the constraint member may be provided on a side of the flexible plate opposite to the base member; the third electrode may be provided on the constraint member; and a direction in which the flexible plate is deflected when the voltage is applied between the first electrode and the second electrode may be opposite to a direction in which the flexible plate is deflected when the voltage is applied between the second electrode and the third electrode.

The optical device may further comprise a mechanism which is connected to the constraint member and which changes a position of the constraint member with respect to the flexible plate. In the optical device, the constraint member may be displaced by the mechanism to a position at which the constraint member is brought in contact with the flexible plate. In the optical device, the third electrode may be provided on the constraint member; and the flexible plate may be constrained by the constraint member so that the optical element is arranged to be parallel to the base member by the electrostatic force generated between the second electrode and the third electrode when the voltage is applied between the second electrode and the third electrode.

In the optical device, the third electrode may be provided on the constraint member; and the optical element may be constrained by the constraint member so that the optical element is arranged to be parallel to the base member by the electrostatic force generated between the second electrode and the third electrode when the voltage is applied between the second electrode and the third electrode. A part of the optical element and the second electrode may be electrically connected to each other; and a direction in which the flexible plate is deflected when the voltage is applied between the first electrode and the second electrode may be same as a direction in which the flexible plate is deflected when the voltage is applied between the second electrode and the third electrode.

A display apparatus according to the embodiment of the present invention is a display apparatus comprising a spatial optical modulator, wherein the spatial optical modulator is an optical device including the microactuator according to the first aspect of the embodiment of the present invention or the optical device according to the second aspect of the embodiment of the present invention.

An exposure apparatus according to the embodiment of the present invention is an exposure apparatus which exposes an object by using an illumination light, the exposure apparatus comprising the optical device according to the second aspect of the embodiment of the present invention or an optical device including the microactuator according to the first aspect of the embodiment of the present invention which is arranged on an optical path of the illumination light; wherein the object is exposed with the illumination light via the optical device. In the exposure apparatus, the optical device may generate a predetermined pattern by being irradiated with the illumination light. The exposure apparatus may further comprise a movable member which is movable while holding the object; wherein the driving force applying device of each of the microactuators of the optical device may be controlled in synchronization with movement of the movable member in a predetermined direction.

A method for producing a device according to the embodiment of the present invention is a device production method comprising a lithography step; wherein the lithography step includes exposing a substrate by using the exposure apparatus as defined above, and processing the exposed substrate after being developed.

BRIEF DESCRIPTION OF THE DRAWINGS

FIG. 3 shows a schematic plan view schematically illustrating a plate-shaped member of the unit element shown in FIG. 1.

FIG. 4 shows a schematic sectional view taken along a line IV-IV shown in FIG. 2.

FIG. 5 shows a schematic sectional view taken along a line V-V shown in FIG. 2.

FIG. 7 shows an exemplary arrangement of the unit elements in the optical device according to the first embodiment of the present invention.

FIGS. 12A and 12B schematically show respective operation states of an optical device concerning Comparative Example.

FIG. 13 shows a schematic construction of a projection display apparatus (projection type display apparatus) according to a second embodiment of the present invention.

FIG. 29 shows a schematic sectional view taken along a line XXIX-XXIX shown in FIG. 27.

FIGS. 30A and 30B schematically show respective operation states of the optical device according to a sixth embodiment of the present invention.

DESCRIPTION OF THE PREFERRED EMBODIMENTS

An explanation will be made below with reference to the drawings about the microactuator, the optical device, the display apparatus, the exposure apparatus, and the method for producing the device according to the embodiments of the present invention.

First Embodiment

Figure 1:
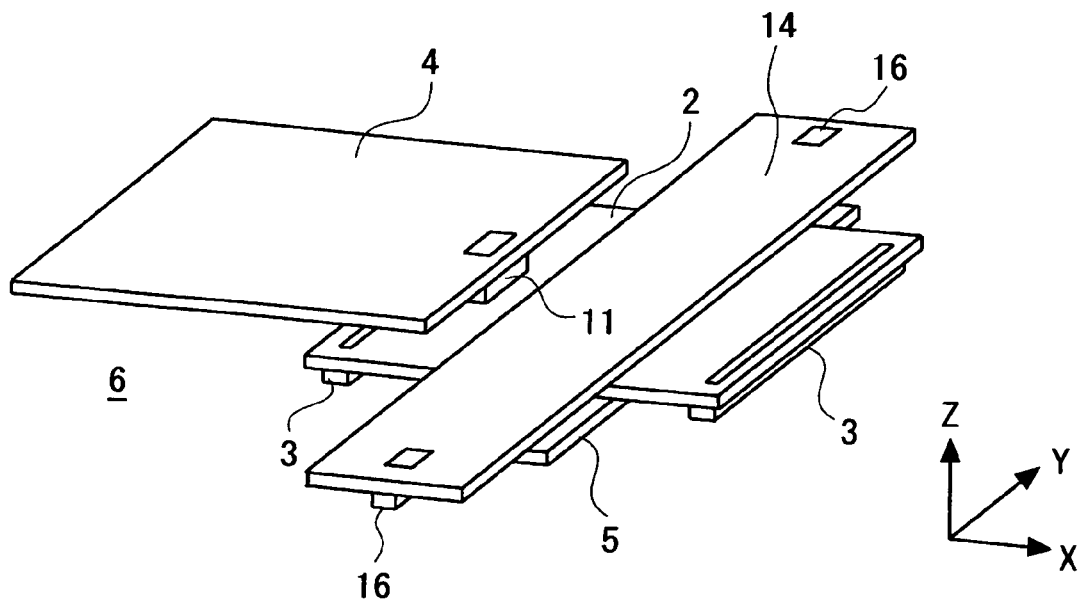
FIG. 1 shows a schematic perspective view schematically illustrating a unit element of an optical device according to a first embodiment of the present invention.
Figure 2:
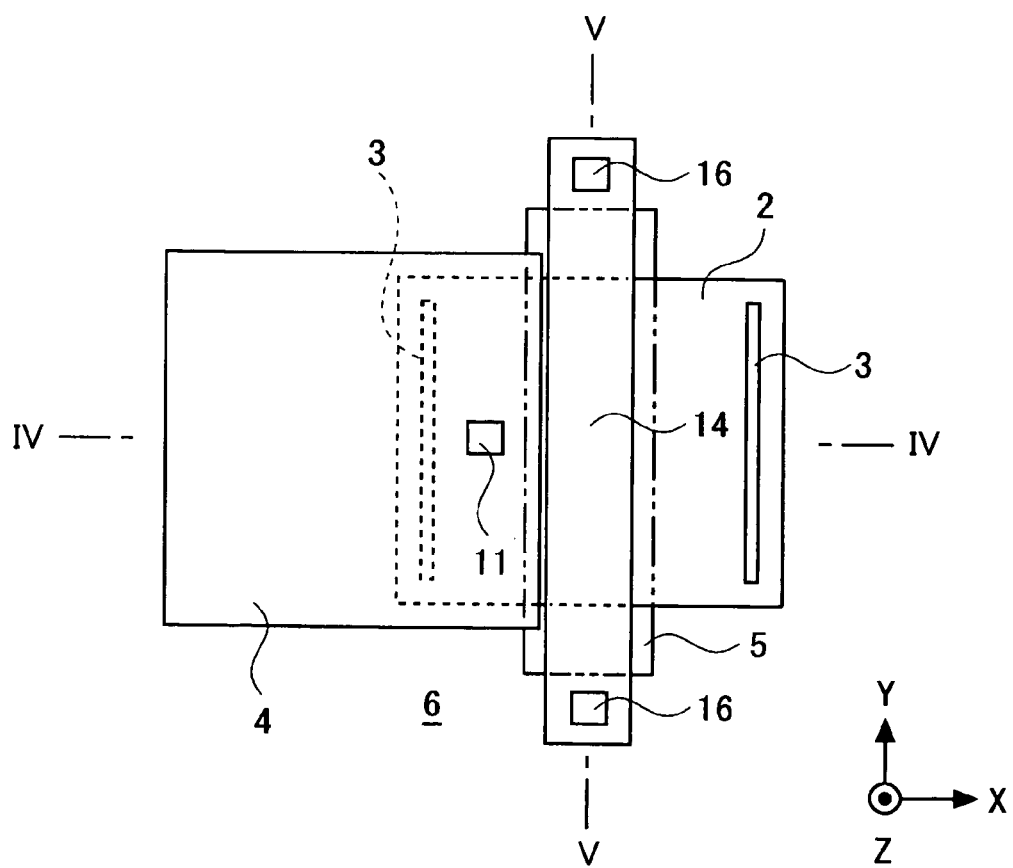
FIG. 2 shows a schematic plan view schematically illustrating the unit element shown in FIG. 1.

FIG. 1 shows a schematic perspective view schematically illustrating a microactuator and a unit element of an optical device including the same according to a first embodiment of the present invention. FIG. 2 shows a schematic plan view schematically illustrating the unit element shown in FIG. 1. In FIGS. 1 and 2, a planarizing (planarized) film 20 is omitted from the illustration. FIG. 3 shows a schematic plan view schematically illustrating a plate-shaped member 2 of the unit element shown in FIG. 1. FIG. 3 also shows a connecting portion 11 described later on together. FIG. 4 shows a schematic sectional view taken along a line IV-IV shown in FIG. 2. FIG. 5 shows a schematic sectional view taken along a line V-V shown in FIG. 2. FIGS. 1 to 5 show the state in which the driving force is not generated.

For the convenience of the explanation, the X axis, the Y axis, and the Z axis, which are perpendicular to one another, are defined as shown in FIGS. 1 to 5 (the same definition is also affirmed in relation to the drawings described later on). A surface of a substrate 1 is parallel to the XY plane. The + side in the Z axis direction is sometimes referred to as "upper side", and the − side in the Z axis direction is sometimes referred to as "lower side". For example, the materials described below are referred to by way of example, to which the present invention is not limited.

As shown in FIG. 4, the optical device according to the embodiment of the present invention has a silicon substrate 1 which constitutes a base member, a plate-shaped member 2 which is supported by the silicon substrate 1 with a leg 3 intervening therebetween (via the leg 3), a mirror 4 which is provided as an optical element that is a driving objective, a lower fixed electrode (second electrode portion) 5, and a beam member 14 which is arranged on the upper side of the plate-shaped member 2. The base member includes not only the silicon substrate 1 but also an insulating film 6, the lower fixed electrode 5, and the planarizing film 20 which are formed on the silicon substrate 1. The lower fixed electrode 5 is provided on the base member. The driving objective, which is to be driven by the microactuator according to the present invention, is not limited to the mirror 4. For example, the driving objective may be any other optical element including a diffraction optical element, an optical filter, a photonic crystal, etc. Alternatively, the driving objective may be any member other than the optical element.

In this embodiment, the plate-shaped member 2 has a rectangular shape as seen in a plan view in the Z axis direction. When the electrostatic force, which acts as the driving force as described later on, is not applied, the principal plane of the plate-shaped member 2 is parallel to the XY plane as shown in FIGS. 1 to 5.

The plate-shaped member 2 is fixed to the substrate 1 via a pair of legs 3 at a position disposed in the vicinity of one side on the +X side and at a position disposed in the vicinity of one side on the −X side which are the two portions or places opposed to each other at the circumferential portions of the plate-shaped member 2. Therefore, in this embodiment, the plate-shaped member 2 is a bridge beam. An area, of the plate-shaped member 2, which is provided between the leg 3 disposed on the +X side and the leg 3 disposed on the −X side is a deflectively deformable area (flexibly deformable area). The pair of legs 3 are provided on wiring pattern portions 7 (see FIG. 4, omitted from FIGS. 1 and 2) each of which is constructed of an aluminum film formed on the insulating film 6 such as a silicon oxide film or the like on the substrate 1 and the planarizing film 20 (see FIGS. 4 and 5, omitted from FIGS. 1 and 2) which is formed of a silicon oxide film or the like.

The plate-shaped member 2 is constructed of thin films. The plate-shaped member 2 is constructed of a three-layered film obtained by stacking a silicon nitride film 8 which is provided as a lower insulating film, an intermediate aluminum film 9, and an upper silicon nitride film 10.

In this embodiment, the leg 3 is constructed such that the silicon nitride films 8, 10 and the aluminum film 9, which constitute the plate-shaped member 2, extend while being bent toward the wiring pattern 7 of the substrate 1. The aluminum film 9 is connected to the wiring pattern 7 via openings formed through the silicon nitride film 8 and the planarizing film 20 at the leg 3 respectively.

In this embodiment, the mirror 4 is constructed of a thin film. The mirror 4 is constructed of an aluminum film 12. The mirror 4 has a rectangular shape as seen in a plan view in the Z axis direction. When the electrostatic force is not applied as the driving force as described later on, then the principal plane of the mirror 4 is parallel to the XY plane as shown in FIGS. 1 to 5, and the principal plane of the mirror 4 is parallel to the principal plane of the plate-shaped member 2. Although not shown in the drawings, it is preferable that a stepped portion (rising portion or falling portion) is formed around the mirror 4 to effect the reinforcement, if necessary, in order to enhance the rigidity of the mirror 4.

The mirror 4 is mechanically connected to a portion of the deflectively deformable area of the plate-shaped member 2 via the connecting portion 11, the portion of the deflectively deformable area being eccentric in the −X direction from the center (center of gravity) of the plate-shaped member 2. That is, the mirror 4 and the plate-shaped member 2 are partially (locally) joined to each other via the connecting portion 11. The connecting portion 11 is constructed of the aluminum film 12 which extends from the mirror 4 as it is, and an aluminum film 13 which is disposed on the lower side the aluminum film 12.

In this embodiment, the lower fixed electrode 5 is formed of an aluminum film so that the lower fixed electrode 5 is overlapped with the plate-shaped member 2 over the entire region in the Y axis direction of the plate-shaped member 2 at the position disposed in the vicinity of the center in the X axis direction of the plate-shaped member 2. An area, of the aluminum film 9 constructing the plate-shaped member 2, which is opposite to or facing the lower fixed electrode 5, is a movable electrode (first electrode portion) which is capable of generating electrostatic force between the movable electrode and the fixed electrode 5 by a voltage between the movable electrode and the lower fixed electrode 5. In this embodiment, the movable electrode is capable of generating electrostatic force between the movable electrode and an upper fixed electrode (third electrode portion) by a voltage between the movable electrode and the upper fixed electrode as described later on. The remaining area of the aluminum film 9 provides a wiring pattern for connecting the movable electrode to the wiring pattern 7.

The beam member 14 is constructed of a thin film. The beam member 14 is constructed of an aluminum film 15. The beam member 14 is overlapped with the plate-shaped member 2 over the entire portion in the Y axis direction of the plate-shaped member 2 at the position disposed in the vicinity of the center in the X axis direction of the plate-shaped member 2. Further, the beam member 14 is arranged over or above (on the upper side of) the plate-shaped member 2, and the beam member 14 is provided to interpose or sandwich the plate-shaped member 2 together with the lower fixed electrode 5. An area, of the aluminum film 15 constructing the beam member 14, which is opposite to or facing the movable electrode of the plate-shaped member 2, is the upper fixed electrode (third electrode portion) which is capable of generating the electrostatic force between the upper fixed electrode and the movable electrode by the voltage between the upper fixed electrode and the movable electrode.

The beam member 14 is fixed to the substrate 1 via a pair of legs 16 which rise from the substrate 1 in the vicinity of the end portion on the +Y side and in the vicinity of the end portion on the −Y side of the beam member 14. Accordingly, the beam member 14 is a member which is fixed to the base member (substrate 1). The legs 16 are provided on wiring pattern portions 18 (see FIG. 5, omitted from FIGS. 1 and 2) each of which is constructed of an aluminum film formed on the insulating film 6 on the substrate 1. The leg 16 is constructed of the aluminum film 15 which extends while being bent from the beam member 14 toward the substrate 1, and an aluminum film 17 which covers the lower side portion and the side portion of the aluminum film 15. The aluminum film 17 is connected to the wiring pattern 18 via an opening formed through the planarizing film 20 at the leg 16.

In this embodiment, as described above, the fixed portion of the mirror 4 with respect to the plate-shaped member 2 is eccentric in the −X direction, and the lower fixed electrode 5, the movable electrode, and the upper fixed electrode are arranged at the central portion of the plate-shaped member 2 in the X axis direction. Accordingly, in this embodiment, the lower fixed electrode 5, the movable electrode, and the upper fixed electrode constitute a driving force applying device (driving force applying means) which is capable of applying the driving force (electrostatic force in this embodiment) to a predetermined portion (part of the plate-shaped member 2 in this embodiment) so that the deflectively deformable area of the plate-shaped member 2 is deflectively deformed depending on a signal (the voltage between the lower fixed electrode 5 and the movable electrode and the voltage between the movable electrode and the upper fixed electrode in this embodiment) and the inclination of the fixed portion of the mirror 4 with respect to the plate-shaped member 2 is changed between a first inclination and a second inclination. However, in the present invention, the driving force applying device may be constructed so that any arbitrary driving force other than the electrostatic force can be applied. For example, as for the driving force applying device, it is also allowable that a current passage, which is arranged in a magnetic field to generate the Lorentz force in accordance with application of electricity, is provided for the plate-shaped member 2, or a piezoelectric element is provided to utilize driving force brought about by the piezoelectric element. In the case the latter, for example, a PZT film may be stacked on the plate-shaped member 2 while allowing a plurality of electrode to intervene therebetween, and the voltage can be applied between the electrodes to deflect (flexibly bend) the PZT film.

Figure 6A:
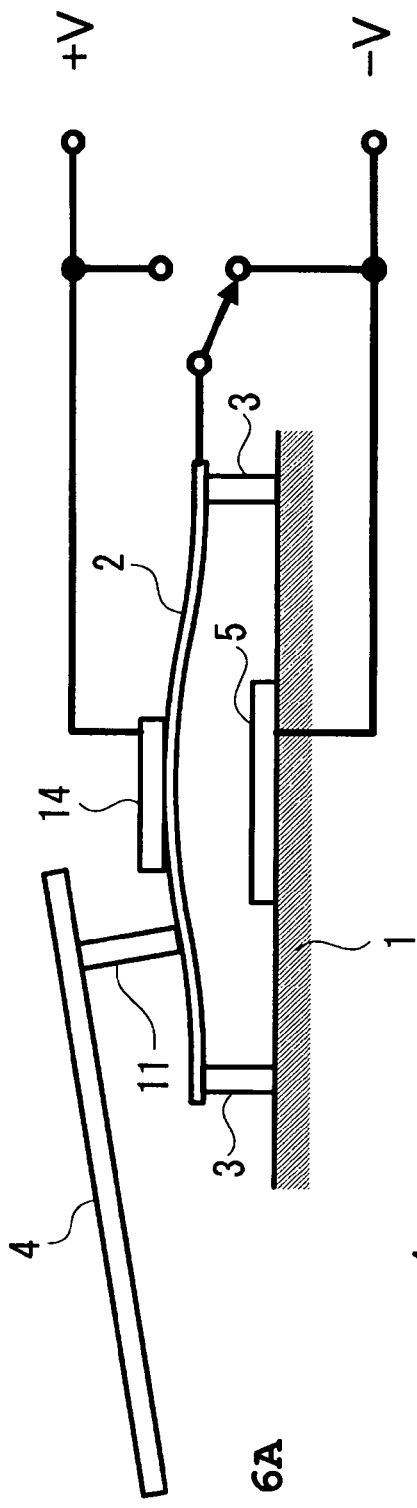
FIGS. 6A and 6B schematically show respective operation states of the optical device according to the first embodiment of the present invention.
Figure 6B:
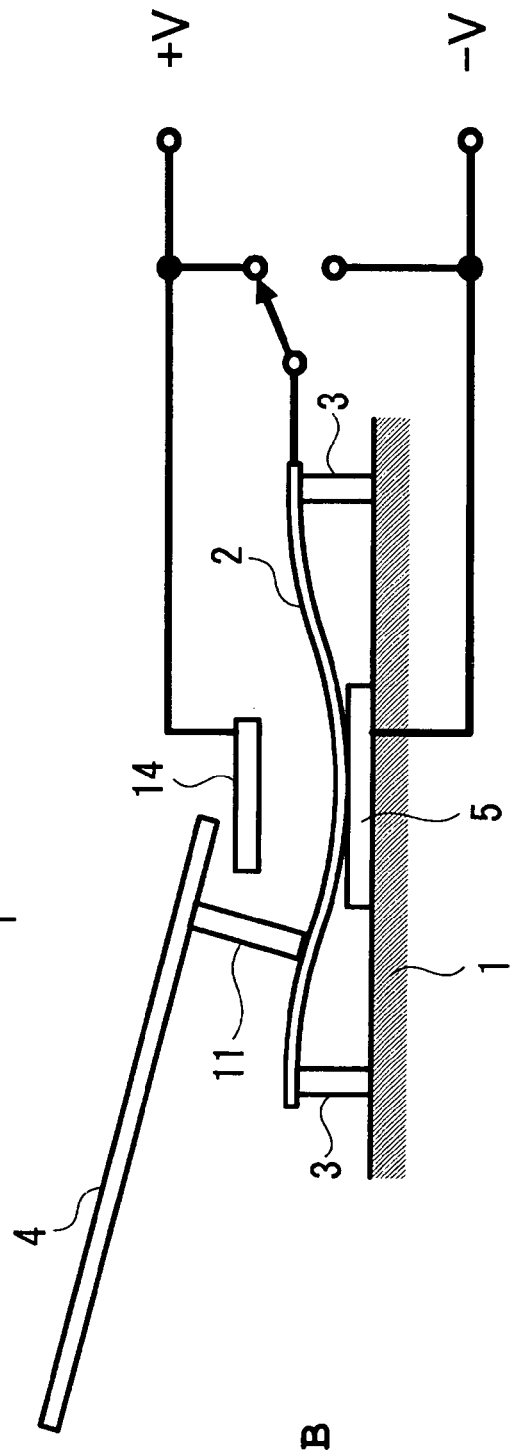

An explanation will now be made with reference to FIG. 6 (FIGS. 6A and 6B) about the operation of the optical device (especially the operation of the unit element) according to the embodiment of the present invention. FIG. 6 schematically shows respective operation states of the optical device according to the embodiment of the present invention, and corresponds to sectional views as obtained by greatly simplifying FIG. 4.

FIG. 6A shows such a state that an electric potential −V is applied to the lower fixed electrode 5 and the movable electrode (area of the aluminum film 9 of the plate-shaped member 9 opposite to the lower fixed electrode 5 and the upper fixed electrode) and an electric potential +V is applied to the upper fixed electrode (area of the aluminum film 15 of the beam member 14 opposite to the aluminum film 9 of the plate-shaped member 2) so that the voltage between the lower fixed electrode 5 and the movable electrode is zero and the electrostatic force is not generated therebetween, while the relatively high voltage (2×V) is applied between the movable electrode and the upper fixed electrode so that the relatively large electrostatic force is generated therebetween. In this state, the plate-shaped member 2 is deformed until the plate-shaped member 2 is brought into abutment against (contact with) the beam member 14, and the plate-shaped member 2 stands still at the position of the abutment (contact). That is, the upper surface of the plate-shaped member 2 is constrained by the beam member 14. As a result, the mirror 4 is displaced (subjected to the switching movement) in a direction in which an end portion, of the mirror 4, which is disposed on the side opposite to the connecting portion 11, approaches the substrate 1, and the mirror 4 is inclined by a predetermined angle (first angle) with respect to the substrate 1.

FIG. 6B shows such a state that the electric potential +V is applied to the movable electrode and the upper fixed electrode and the electric potential −V is applied to the lower fixed electrode 5 so that the voltage between the movable electrode and the upper fixed electrode is zero and the electrostatic force is not generated therebetween, while the relatively high voltage (2×V) is applied between the movable electrode and the lower fixed electrode 5 so that the relatively large electrostatic force is generated therebetween. In this state, the plate-shaped member 2 is deformed until the plate-shaped member 2 is brought into abutment against (contact with) the side of the substrate 1, and the plate-shaped member 2 stands still at the position of the abutment. That is, the lower surface of the plate-shaped member 2 is constrained by the substrate 1. As a result, the end portion, of the mirror 4, which is disposed on the side opposite to the connecting portion 11, is displaced (subjected to the switching movement) in a direction in which the end portion of the mirror 4 is separated (away) from the substrate 1 (toward the side opposite to that of the case shown in FIG. 6A), and the mirror 4 is inclined by a predetermined angle (second angle) with respect to the substrate 1.

In this embodiment, it is also allowable to adopt DC (direct current) driving in which the DC voltage is applied between the electrodes. Alternatively, it is also allowable to adopt the AC (alternate current) driving in which the AC pulse is applied between the both electrodes. It is preferable to adopt the AC driving in order to avoid influence of the charge-up, etc.

An explanation will now be made with reference to FIG. 12 about an optical device of Comparative Example which is comparable with the optical device according to the embodiment of the present invention. FIG. 12 shows a structure disclosed, for example, in Japanese Patent Application Laid-open No. 2007-312553. FIG. 12 schematically shows respective operation states of the optical device concerning Comparative Example, and corresponds to FIG. 6. Comparative Example is structurally different from the embodiment of the present invention only in that the beam member 14 (as well as the upper fixed electrode) is removed.

FIG. 12A shows such a state that the electric potential −V is applied to the lower fixed electrode 5 and the movable electrode so that the voltage between the lower fixed electrode 5 and the movable electrode is zero and the electrostatic force is not generated therebetween. In this state, the plate-shaped member 2 is not deformed, and the plate-shaped member 2 has the flat shape. Therefore, the mirror 4 is maintained to be parallel to the substrate 1.

FIG. 12B shows such a state that the electric potential +V is applied to the movable electrode and the electric potential −V is applied to the lower fixed electrode 5 so that the relatively high voltage (2×V) is applied between the movable electrode and the lower fixed electrode 5 and the relatively large electrostatic force is generated therebetween. In this state, the plate-shaped member 2 is deformed until the abutment against (contact with) the side of the substrate 1, and the plate-shaped member 2 stands still at the position of the abutment. As a result, the mirror 4 is inclined with respect to the substrate 1. The state shown in FIG. 12B is the same as the state shown in FIG. 6B.

In Comparative Example, when the state is switched from the state shown in FIG. 12B to the state shown in FIG. 12A upon the driving, then the deformable area of the plate-shaped member 2 is deflectively (flexibly) deformed upwardly and downwardly to cause the vibration, and the amount of deflection is gradually attenuated. That is, the plate-shaped member 2 is freely vibrated without making any abutment against (any contact with) any other member. Therefore, the settling time, which elapses until the plate-shaped member 2 returns to the state shown in FIG. 12A, is prolonged.

On the contrary, in the embodiment of the present invention, when the state is switched from the state shown in FIG. 6B to the state shown in FIG. 6A, the plate-shaped member 2 instantaneously abuts against the beam member 14, and the plate-shaped member 2 is pressed and held (constrained). Therefore, the settling time, which elapses until the plate-shaped member 2 returns to the state shown in FIG. 6A, is shortened. Therefore, according to the embodiment of the present invention, the driving can be performed at the higher speed as compared with Comparative Example.

The unit element of the optical device according to the embodiment of the present invention has been explained above, wherein the microactuator, which drives the mirror 4, is constructed by the constitutive elements other than the mirror 4 of the structure of the unit element described above.

In the optical device according to this embodiment, as shown in FIG. 7, the unit elements shown in FIGS. 1 to 5 described above are arranged two-dimensionally on the substrate 1. Accordingly, the optical device of this embodiment constitutes a spatial optical modulator. FIG. 7 shows 4×4 arrayed unit elements for the purpose of simplification. However, the number of the unit elements may be any number. In FIG. 7, one mirror 4 corresponds to one unit element. However, constitutive elements of each of the unit elements other than the mirror 4 is omitted from the illustration for the purpose of simplification. The way of alignment or arrangement of the unit elements is not limited to the exemplary case shown in FIG. 7. It is also allowable to adopt, for example, a way of alignment in which the unit elements are shifted or deviated by every half pitch for each of the columns or each of the rows. Alternatively, the unit elements may be arranged one-dimensionally. In FIG. 7, the mirror 4, which is disposed in the 2nd row and the 2nd column, is in the state shown in FIG. 6B, and the other mirrors 4 are in the state shown in FIG. 6A. However, in FIG. 7, for the convenience of the illustration of the drawing, the other mirrors 4 are depicted as if the other mirrors 4 are parallel to the substrate 1.

Although not shown in the drawings, the optical device of this embodiment adopts such a driving circuit that the voltage state between the electrodes of each of the unit elements is determined so that the state of the mirror 4 of each of the unit elements is in the state corresponding to the control signal. Those adoptable as the driving circuit as described above include, for example, a driving circuit which is same as or equivalent to, for example, DMD, etc. Alternatively, it is also allowable to adopt a driving system as disclosed, for example, in Japanese Patent Application Laid-open No. 2004-184564.

Figure 10A:
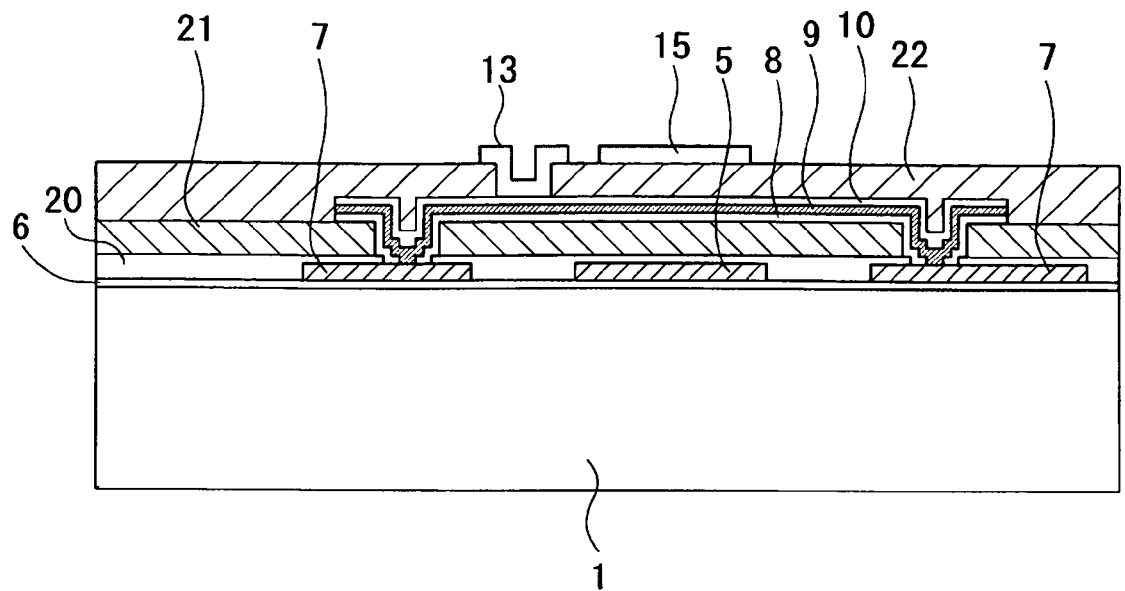
FIGS. 10A and 10B show steps continued from those shown in FIG. 9.
Figure 10B:
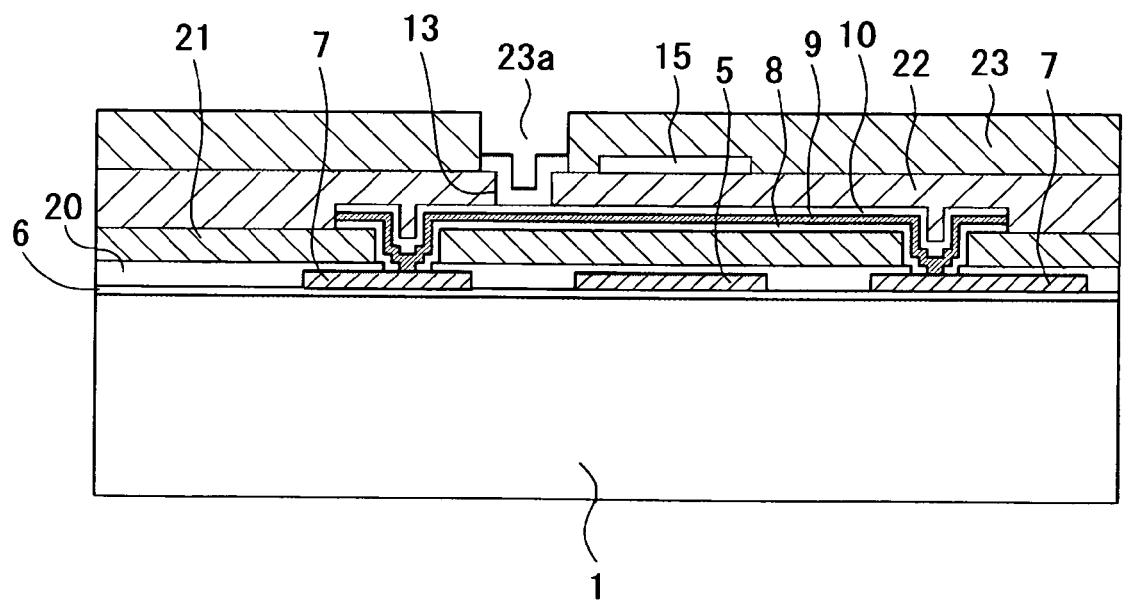
Figure 11A:
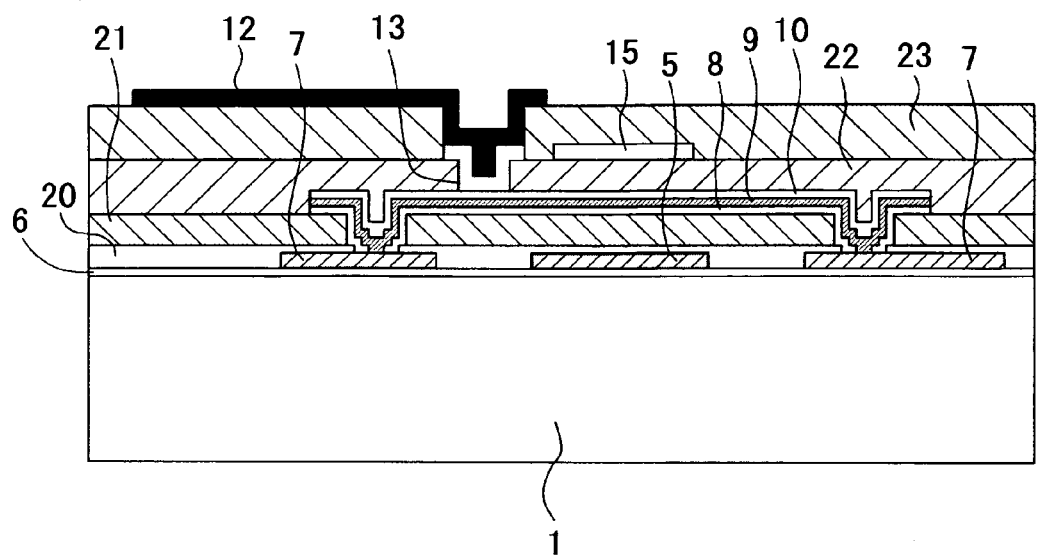
FIGS. 11A and 11B show steps continued from those shown in FIG. 10.
Figure 11B:
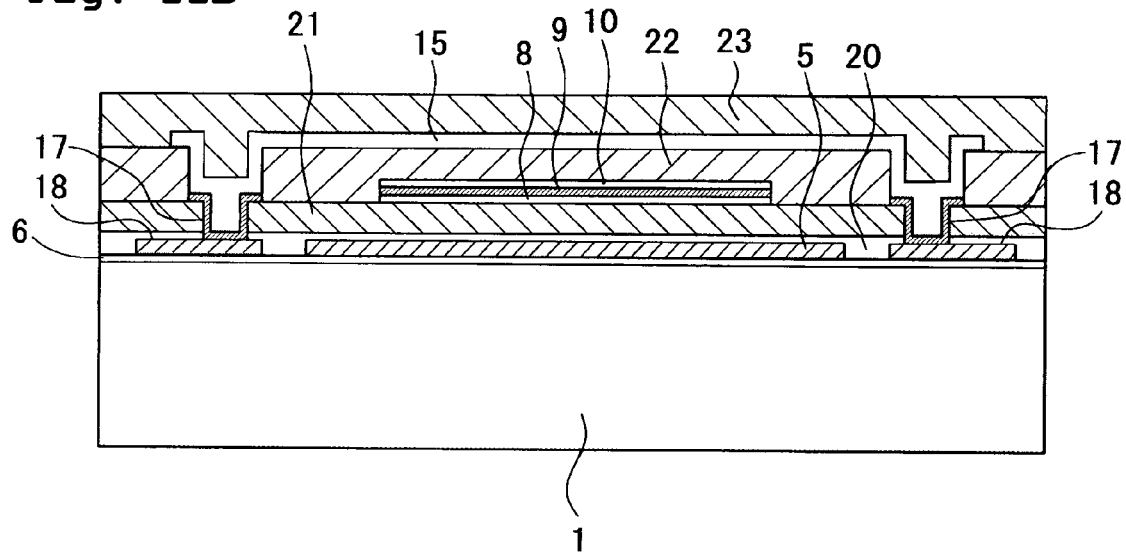

An explanation will now be made with reference to FIGS. 8 to 11 about an example of the method for producing the optical device according to the embodiment of the present invention especially taking the notice of the unit element. FIGS. 8 to 11 show sectional views illustrating the respective production steps, and correspond to FIG. 4 except for FIG. 11B. FIG. 11B corresponds to FIG. 5. FIGS. 11A and 11B show the same step. Reference may be also made to FIG. 11B, if necessary, in relation to the other steps explained below.

Figure 8A:
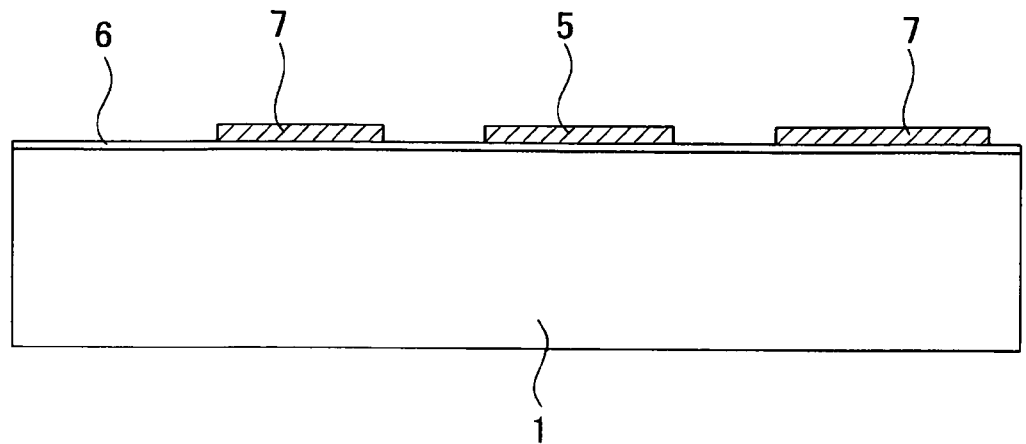
FIGS. 8A to 8C show steps illustrating a method for producing the optical device according to the first embodiment of the present invention.

At first, a silicon oxide film 6 is formed on the silicon substrate 1. Subsequently, an aluminum film is formed. The aluminum film is patterned (subjected to the patterning) into the shapes of the lower fixed electrode 5 and the wiring patterns 7, 18 by the photolitho-etching method (FIG. 8A).

Figure 8B:
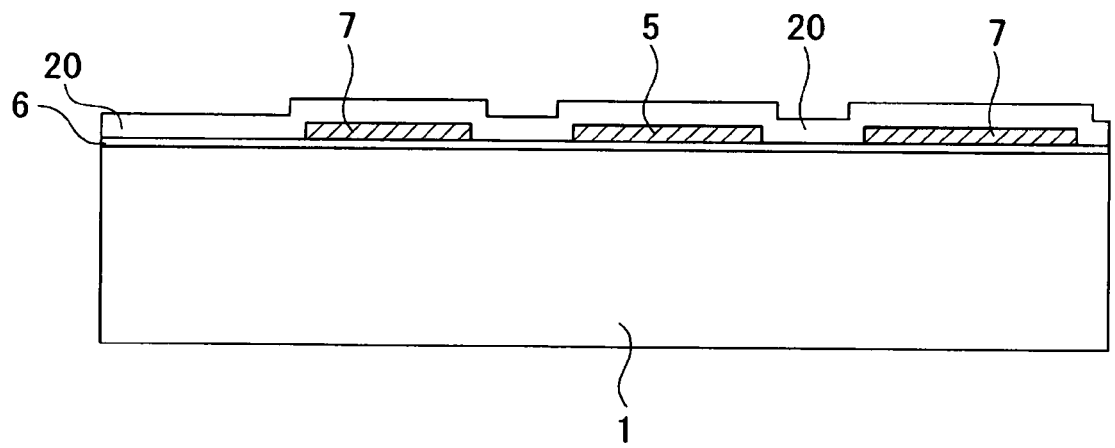
Figure 8C:
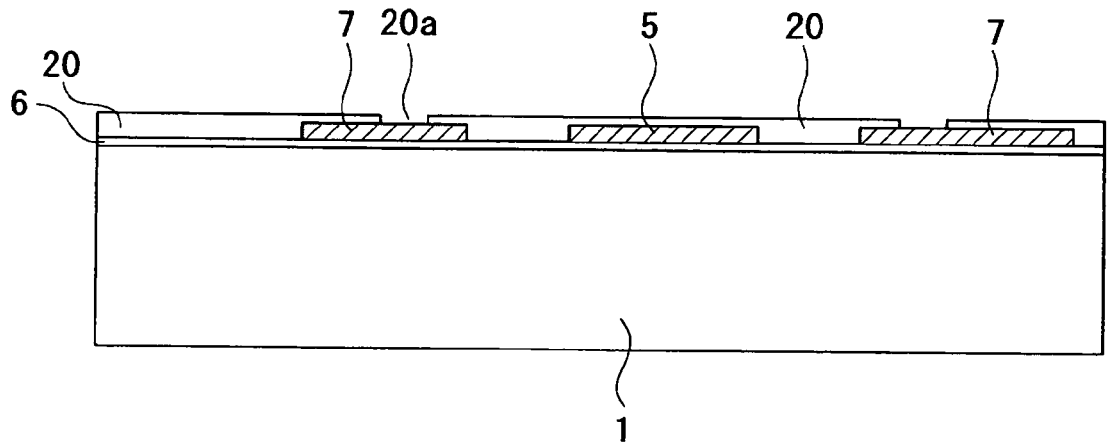

Subsequently, a silicon oxide film 20, which is to be provided as the planarizing film, is formed (FIG. 8B). Subsequently, the silicon oxide film 20 is planarized by CMP to provide the planarizing film. Contact holes 20a are formed by the photolithography at positions of the planarizing film 20 at which the legs 3, 16 are to be formed (FIG. 8C).

Figure 9A:
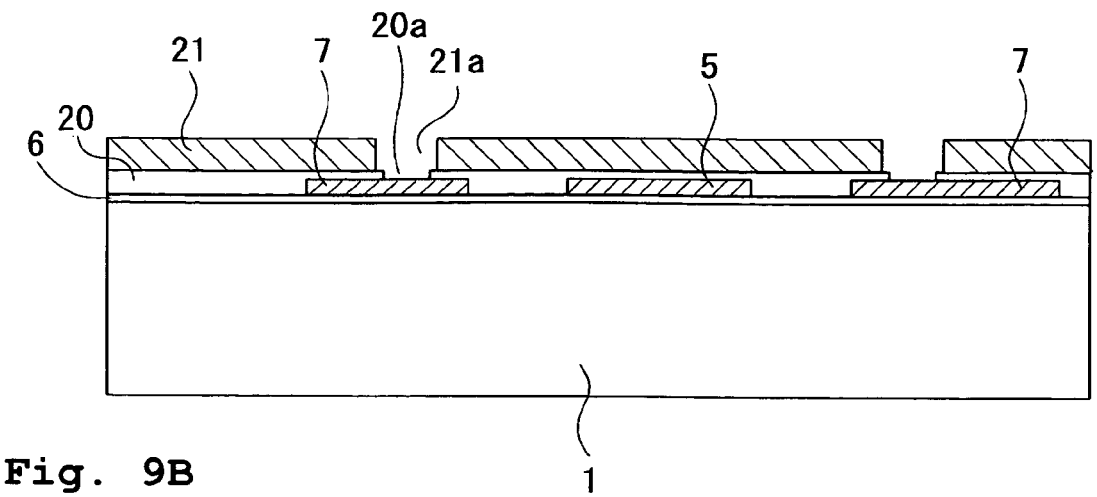
FIGS. 9A to 9C show steps continued from those shown in FIG. 8.

Subsequently, a sacrifice layer 21 of a photoresist or the like is formed by the spin coating. Openings 21a are formed by the photolithography at positions of the sacrifice layer 21 at which the legs 3, 16 are to be formed (FIG. 9A).

Figure 9B:
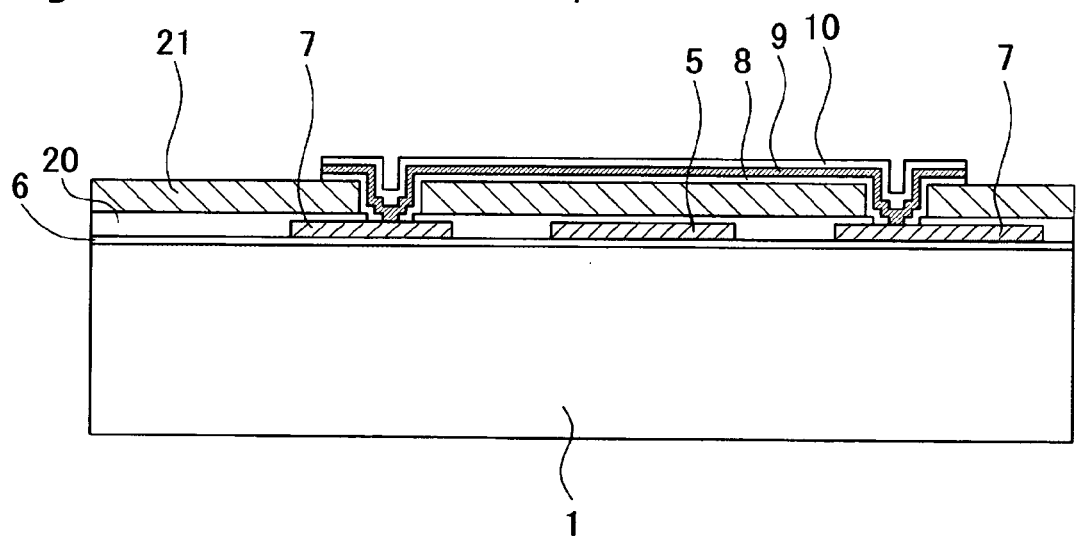

After that, a silicon nitride film 8 is formed. The film 8 is patterned into the shape of the plate-shaped member 2 by the photolitho-etching method. In this situation, openings are formed for the silicon nitride film 8 at the legs 3 so that the aluminum film 9 is electrically connected to the wiring pattern 7 at the legs 3. Subsequently, an aluminum film is formed. The aluminum film is patterned into the shape of the aluminum film 9 of the plate-shaped member 2 and the shape of the aluminum film 17 of the leg 16 by the photolitho-etching method. Subsequently, a silicon nitride film 10 is formed. The film 10 is patterned into the shape of the plate-shaped member 2 by the photolitho-etching method (FIG. 9B).

Figure 9C:
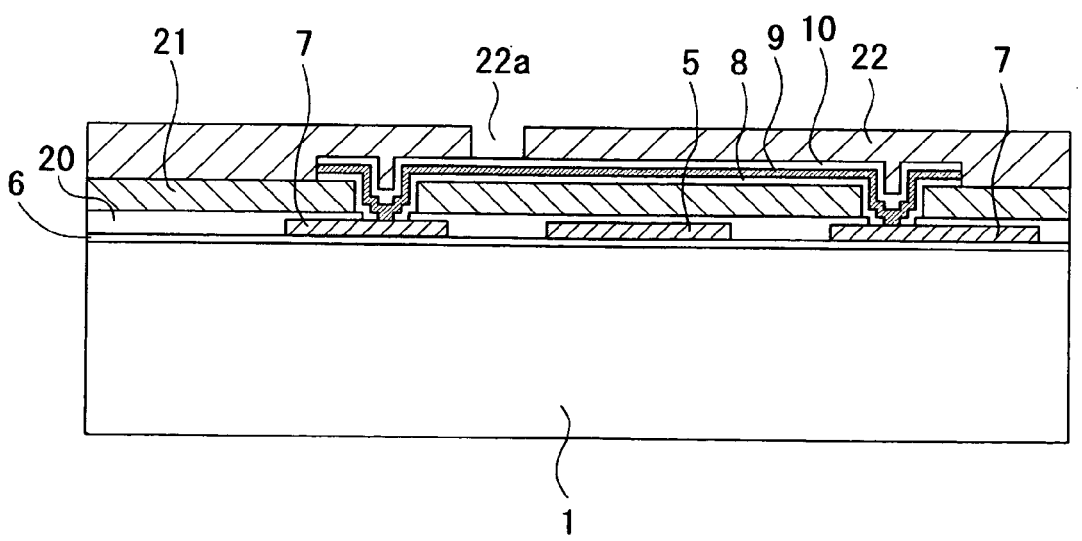

Subsequently, a sacrifice layer 22 of a photoresist or the like is formed. Openings 22a are formed at positions of the sacrifice layer 22 at which the connecting portions 11, 16 are to be formed, by the photolithography (FIG. 9C).

Subsequently, an aluminum film is formed. The aluminum film is patterned into the shape of the aluminum film 15 of the beam member 14 and the shape of the aluminum film 13 of the connecting portion 11 by the photolitho-etching method (FIG. 10A).

Subsequently, a sacrifice layer 23 of a photoresist or the like is formed. Openings 23a of the sacrifice layer 23 are formed at positions at which the legs 16 are to be formed, by the photolithography (FIG. 10B).

After that, an aluminum film is formed. The aluminum film 12 is patterned into the shape of the mirror 4 by the photo-litho-etching method (FIGS. 11A and 11B). Finally, the sacrifice layers 21 to 23 are removed by the plasma ashing, etc. Accordingly, the optical device according to the embodiment of the present invention is completed.

According to this embodiment, the plate-shaped member 2 is the bridge beam. Therefore, the damage or breakage hardly occurs, it is possible to prolong the service life, it is possible to enhance the natural frequency, and it is possible to quicken the response speed, as compared with any case in which the torsion hinge is used in the same manner as in the device disclosed in Japanese Patent Application Laid-open No. 2005-24966 described above.

According to this embodiment, the mirror 4 is not entirely integrated with the plate-shaped member 2 unlike the device disclosed in Japanese Patent Application Laid-open No. 2005-24966 described above. The mirror 4 is mechanically connected locally to the partial portion of the deflectively deformable area of the plate-shaped member 2 via the connecting portion 11. Therefore, as shown in FIG. 6 described above, it is possible to change only the direction of the mirror 4 without deforming the mirror 4 itself.

Further, according to this embodiment, as described above, when the state is switched from the state shown in FIG. 6B to the state shown in FIG. 6A, then the plate-shaped member 2 abuts against or contact with the beam member 14, and the plate-shaped member 2 is pressed and held as shown in FIG. 6A. Therefore, the settling time is shortened, and the driving can be performed at a higher speed.

In the present invention, it is not necessarily indispensable that a plurality of the unit elements described above are arranged on the substrate 1. It is also allowable that only one unit element described above is arranged on the substrate 1.

Second Embodiment

FIG. 13 shows a schematic construction illustrating a projection display apparatus (projection type display apparatus) according to a second embodiment of the present invention.

The projection display apparatus according to the present invention includes a light source 31, an illumination optical system 32, a spatial optical modulator 33, a light-absorbing plate 34, a projection optical system 35, a screen 36, and a control section 37. In this embodiment, the optical device according to the first embodiment described above is used as the spatial optical modulator 33.

An illumination light (illumination light beam), which is emitted from the light source 31, passes through the illumination optical system 32, and then the illumination light is irradiated (radiated) onto the spatial optical modulator 33. It is assumed that the respective unit elements of the spatial optical modulator 33 include the mirrors 4 each of which has the first angle (state shown in FIG. 6A) or the second angle (state shown in FIG. 6B). At the first angle, the incident light is reflected in the first direction; and the light (light beam) arrives at the light-absorbing plate 34, and the light is extinguished. At the second angle, the incident light is reflected in the second direction; and the light passes through the projection optical system 35, and then the light is projected onto the screen 36. The control section 37 supplies the control signal to the spatial optical modulator 33 in accordance with the image signal to control the spatial optical modulator 33, and to change the angles of the mirrors 4 of the respective unit elements depending on the image signal. In accordance with this control, a still image or an animation image (movie image, moving picture), which is indicated by the inputted image signal, can be formed on the screen 36.

This embodiment is an example of the so-called black and white display apparatus. However, it is also possible to achieve a color system by appropriately utilizing the conventional technique. Although not shown, for example, the color system can be achieved by providing (arranging) a color wheel in the illumination optical system 32 or between the illumination optical system 32 and the spatial optical modulator 33, or by providing a light source 31 which is capable of successfully performing the time-sharing control of the three colors of red, blue, and green and synchronizing the light source 31 with the spatial optical modulator 33.

The projection display apparatus, which uses the optical device according to the present invention, is not limited to the display apparatus of the type as described in this embodiment. The present invention is usable for projection display apparatuses of various types. Various projection image display apparatuses have been suggested as exemplary constructions, in which, a liquid crystal panel or DMD, etc. is used as the spatial optical modulator. Regarding an optical system to be used for a projection image display apparatus using DMD, it is possible to use the spatial optical modulator based on the optical device of the present invention as a mirror device in a projection image display apparatus using DMD, because in the spatial optical modulator based on the optical device of the present invention the mirror angle is changed in the same manner as in DMD. The projection image display apparatus using the liquid crystal panel, uses the polarized light beam in principle, and includes not only those of the reflection type but also those of the transmission type. Therefore, in a case that such an optical system is adapted to the spatial optical modulator based on the optical device according to the present invention, any change or modification may be applied in relation to the foregoing points.

The way of application using the spatial optical modulator includes not only the way of use for the screen image produced by the projection image display apparatus or the like and an exposure apparatus as described later on but also various ways of use including, for example, the optical information processing apparatus as described above, an electrostatic photograph printing apparatus, an optical switch used for optical communication, a switched blazed grating device, and a plate setter used in the field of the printing. The present invention is also applicable to those.

Third Embodiment

Figure 14:
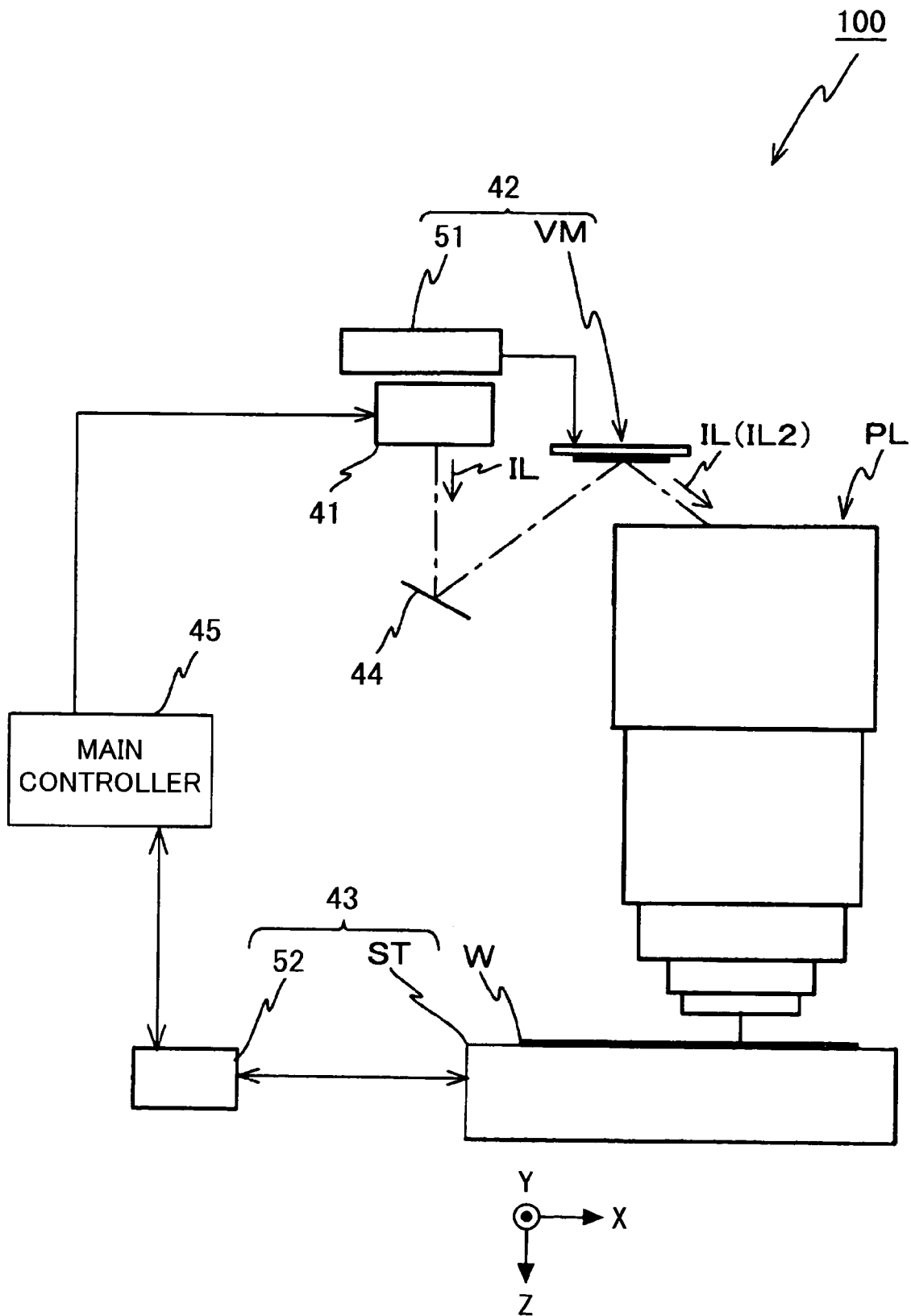
FIG. 14 shows a schematic construction of an exposure apparatus according to a third embodiment of the present invention.

FIG. 14 shows a schematic construction illustrating an exposure apparatus 100 according to a third embodiment of the present invention.

The exposure apparatus 100 according to this embodiment includes an illumination system 41, a pattern generating device 42, a projection optical system PL, a stage device 43, a reflecting mirror 44, a control system, etc. In this exposure apparatus 100, an image of a pattern (pattern image), which is generated by the pattern generating device 42, is formed by using the projection optical system PL on a wafer W which is placed on a stage ST constructing a part of the stage device 43. The control system includes a microcomputer. The control system is principally constructed by a main controller 45 which integrally controls the entire apparatus.

The illumination system 41 includes a light source system which includes a light source unit and a light source control system, and an illumination optical system which includes, for example, a collimator lens, an optical integrator (a fly's eye lens, a rod type integrator, or a diffraction element, etc.), a condenser lens, a field stop, a relay lens, etc. (any one of these components is not shown). An illumination light IL is emitted from the illumination system 41.

A high harmonic wave generator is used as the light source unit, which includes a solid-state laser light source such as a DFB semiconductor laser, a fiber laser or the like, a light amplifying section having a fiber amplifier or the like, a wavelength converting unit, etc. and which outputs a pulsed light (pulsed light beam) having a wavelength of 193 nm, as disclosed, for example, in International Publication No. 1999/46835 (corresponding to U.S. Pat. No. 7,023,610). The light source unit may be a laser diode, etc. which emits, for example, a continuous light or a pulsed light having a wavelength of 440 nm.

The reflecting mirror 44 reflects the illumination light IL emitted or existing from the illumination system 41 to a variable shaped mask VM of the pattern generating device 42 as described later on. The reflecting mirror 44 actually constitutes a part of the illumination optical system included in the illumination system 41. However, for the purpose of convenience of the explanation herein, the reflecting mirror 44 is depicted as being taken out to the outside of the illumination system 41.

The pattern generating device 42 includes the variable shaped mask VM, a mirror driving system 51, etc. The variable shaped mask VM is arranged on the −Z side of the projection optical system PL and on the optical path for the illumination light IL reflected by the reflecting mirror 44. In this embodiment, the optical device according to the first embodiment described above is used as the variable shaped mask VM. In this embodiment, when the illumination light IL is irradiated onto the mirror 4 of a certain unit element in the state shown in FIG. 6A, then the illumination light IL is reflected by the mirror 4, and the illumination light IL comes into the projection optical system PL. Further, when the illumination light IL is irradiated onto the mirror 4 of the certain unit element in the state shown in FIG. 6B, the illumination light IL, which is reflected by the mirror 4 of the certain unit element, does not come into (is not allowed to come into) the projection optical system PL. The mirror driving system 51 drives the variable shaped mask VM under the instruction of the main controller 45. The mirror driving system 51 includes a circuit corresponding to the external control circuit as explained in the foregoing first embodiment.

The mirror driving system 51 obtains design data of the pattern (for example, CAD data) among necessary data, required to form the pattern image, from an unillustrated superordinate apparatus via an unillustrated interface. The mirror driving system 51 generates a signal for driving each of the unit elements based on the obtained design data and supplies the signal to the variable shaped mask VM so that the light from the variable shaped mask VM is irradiated via the projection optical system PL onto a comparted area portion as an exposure objective on the wafer W, and that the light from the variable shaped mask VM is not irradiated onto any portion other than the comparted area portion as the exposure objective on the wafer W. Accordingly, the pattern, which corresponds to the design data, is generated by the pattern generating device 42. The pattern, which is generated by the pattern generating device 42, is changed in accordance with the movement of the wafer W in the scanning direction (in the X axis direction in this procedure).

The projection optical system PL has a plurality of optical elements which are arranged in a predetermined positional relationship in a barrel. The projection optical system PL projects the pattern generated by the pattern generating device 42 onto the wafer W arranged on an exposure objective surface, while reducing the pattern at a projection magnification β.

The stage device 43 is provided to move the wafer W as the exposure objective in the XY plane in such a state that the wafer W is subjected to the alignment with respect to the projection optical system PL. The stage device 43 includes the stage ST and a stage driving system 52 which controls the driving of the stage ST.

The stage ST is driven by the stage driving system 52 so that the stage ST is moved three-dimensionally in the XY plane and in the Z axis direction and/or that the stage ST is appropriately inclined with respect to the image plane of the projection optical system PL. Accordingly, the wafer W can be subjected to the alignment with respect to the pattern image as formed via the projection optical system PL. Further, the stage ST is driven by the stage driving system 52 so that the stage ST may be moved at a desired velocity in the scanning direction.

The main controller 45 operates the illumination system 41, the pattern generating device 42, the stage device 43, etc. at appropriate timings, and causes the image of the pattern generated by the pattern generating device 42 to be projected via the projection optical system PL onto an appropriate position on the wafer W. In this process, the main controller 45 causes the mirror driving system 51 to control the variable shaped mask VM in synchronization with the movement of the wafer W effected by the stage device 43.

In a method for producing a device according to an embodiment of the present invention, a semiconductor device is produced by performing a step of designing the function and the performance of the device; a step of forming the wafer from a silicon material; a lithography step including steps of exposing the wafer W via the variable shaped mask VM by the exposure apparatus 100 of the embodiment described above and developing the wafer W; a step of forming a circuit pattern including, for example, the etching; a step of assembling the device (processing steps including a dicing step, a bonding step, and a packaging step); an inspection step, etc. The present invention is applicable not only to the exposure apparatus for producing the semiconductor device but also to exposure apparatuses for producing other various devices.

In the embodiment described above, the mirror is adopted as the optical element. However, the present invention is not limited to this. It is also possible to use any other optical element such as a lens or the like. In the embodiment described above, the pair of the variable shaped mask VM and the projection optical system PL are provided. However, it is also allowable to provide a plurality of pairs of the variable shaped masks VM and the projection optical systems PL. Alternatively, the variable shaped mask or masks MV and the projection optical system or systems PL may be provided, while the number of the former and the number of the latter being different from each other. Further, in the embodiment described above, the optical device according to the first embodiment is used as the variable shaped mask VM. However, the optical device may be also used as a spatial optical modulator which is provided to generate pupil intensity distribution when the modified illumination is performed in an illumination apparatus illuminating an illumination objective surface. Such an illumination apparatus is disclosed, for example, in Japanese Patent Application Laid-open No. 2002-353105 and U.S. Pat. No. 6,737,662.

Fourth Embodiment

Figure 15:
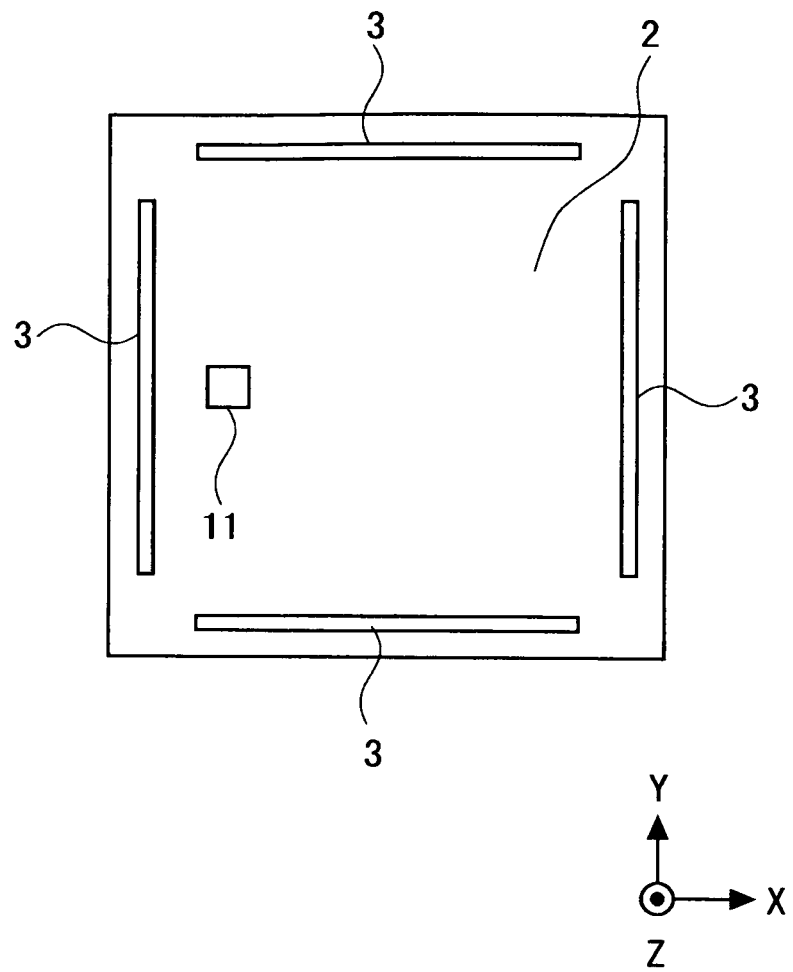
FIG. 15 shows a schematic plan view schematically illustrating a plate-shaped member of a unit element of an optical device according to a fourth embodiment of the present invention.

FIG. 15 shows a schematic plan view schematically illustrating a plate-shaped member 2 of a unit element of an optical device according to a fourth embodiment of the present invention, and corresponds to FIG. 3. In FIG. 15, the elements, which are same as or correspond to the elements shown in FIG. 3, are designated by the same reference numerals, any duplicate explanation of which will be omitted.

The optical device according to this embodiment is different from the optical device according to the first embodiment described above only in that a plate-shaped member 2 is fixed to the substrate 1 at portions disposed in the vicinity of the four sides or edges thereof via legs 3 in this embodiment, while the plate-shaped member 2 is fixed to the substrate 1 only at the portions disposed in the vicinity of the two sides or edges thereof via the legs 3 in the first embodiment described above. That is, the plate-shaped member 2 is supported by the substrate 1 at the outer circumferential portions thereof (not only the sides or edges extending in the Y direction but also the sides or edges extending in the X direction). Accordingly, the deflective area of the plate-shaped member 2 is limited or restricted to the central area thereof, and the resonance frequency of the plate-shaped member 2 is enhanced or increased. Therefore, a higher driving speed is obtained. According to this embodiment, the advantage, which is same as or equivalent to that obtained in the first embodiment described above, is obtained as well.

Fifth Embodiment

Figure 16:
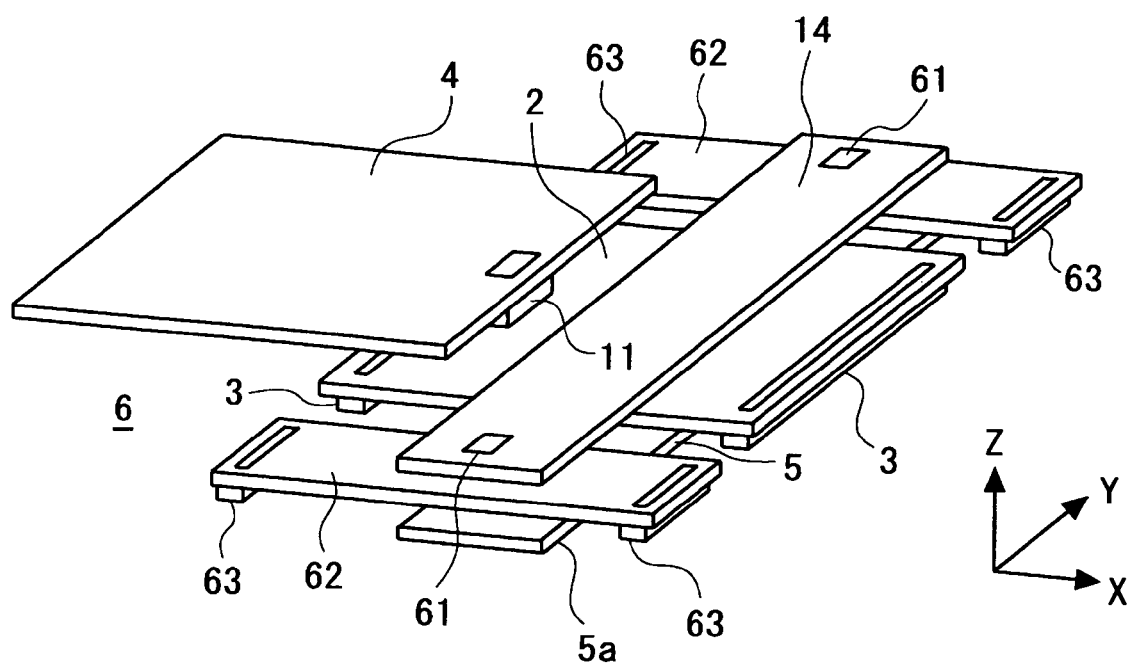
FIG. 16 shows a schematic perspective view schematically illustrating a unit element of an optical device according to a fifth embodiment of the present invention.
Figure 17:
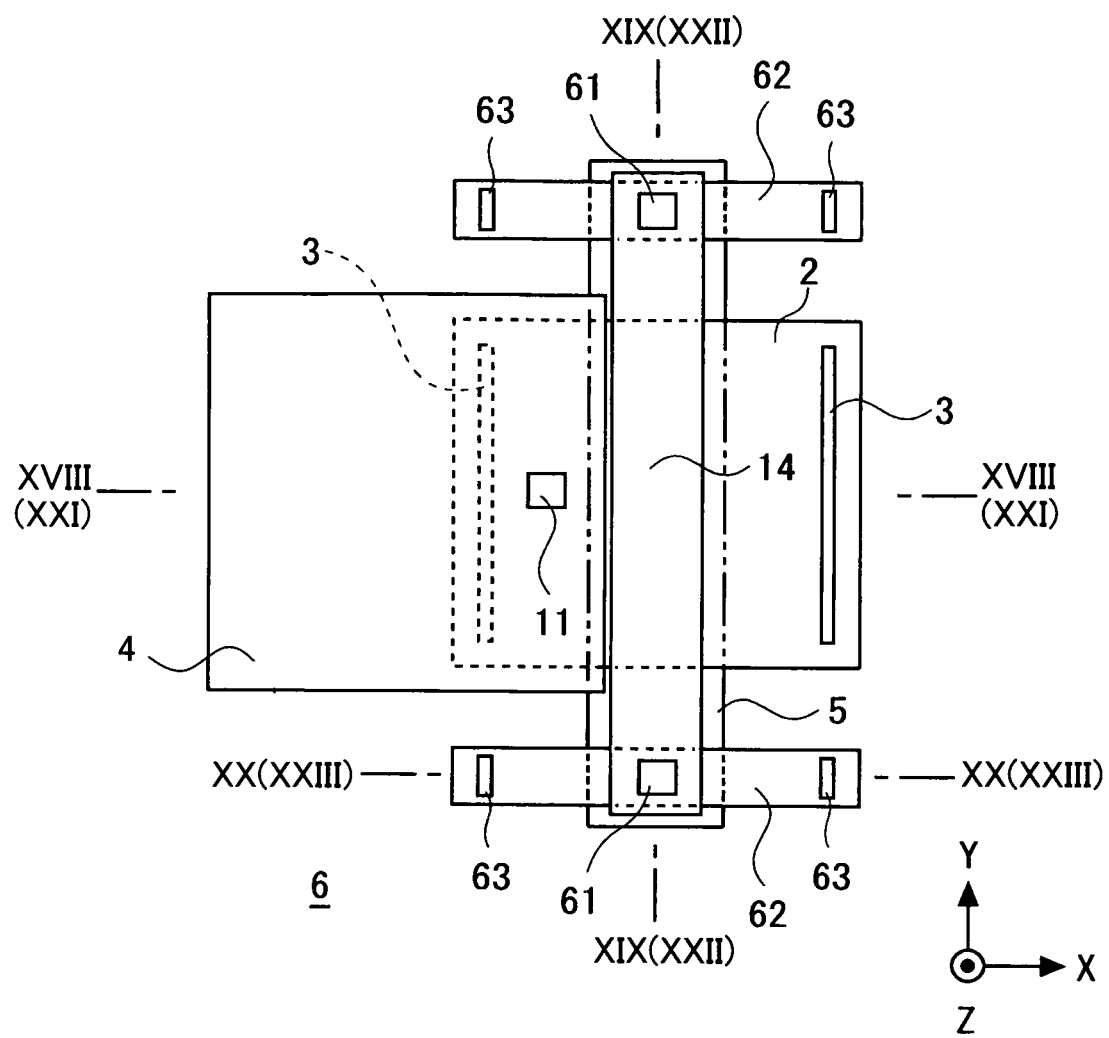
FIG. 17 shows a schematic plan view schematically illustrating the unit element shown in FIG. 16.
Figure 18:
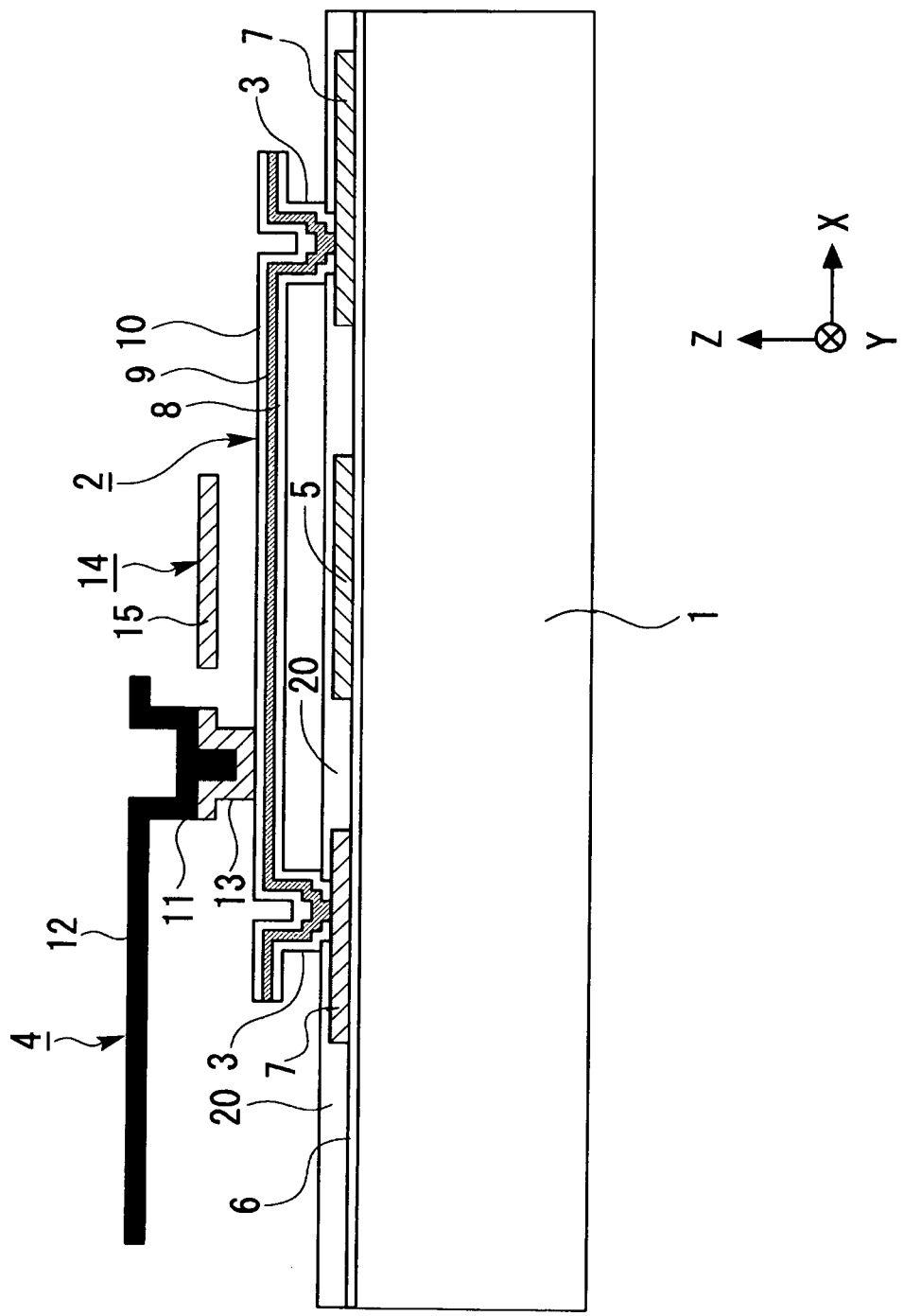
FIG. 18 shows a schematic sectional view taken along a line XVIII-XVIII (XXI-XXI) shown in FIG. 17, illustrating a predetermined state.
Figure 19:
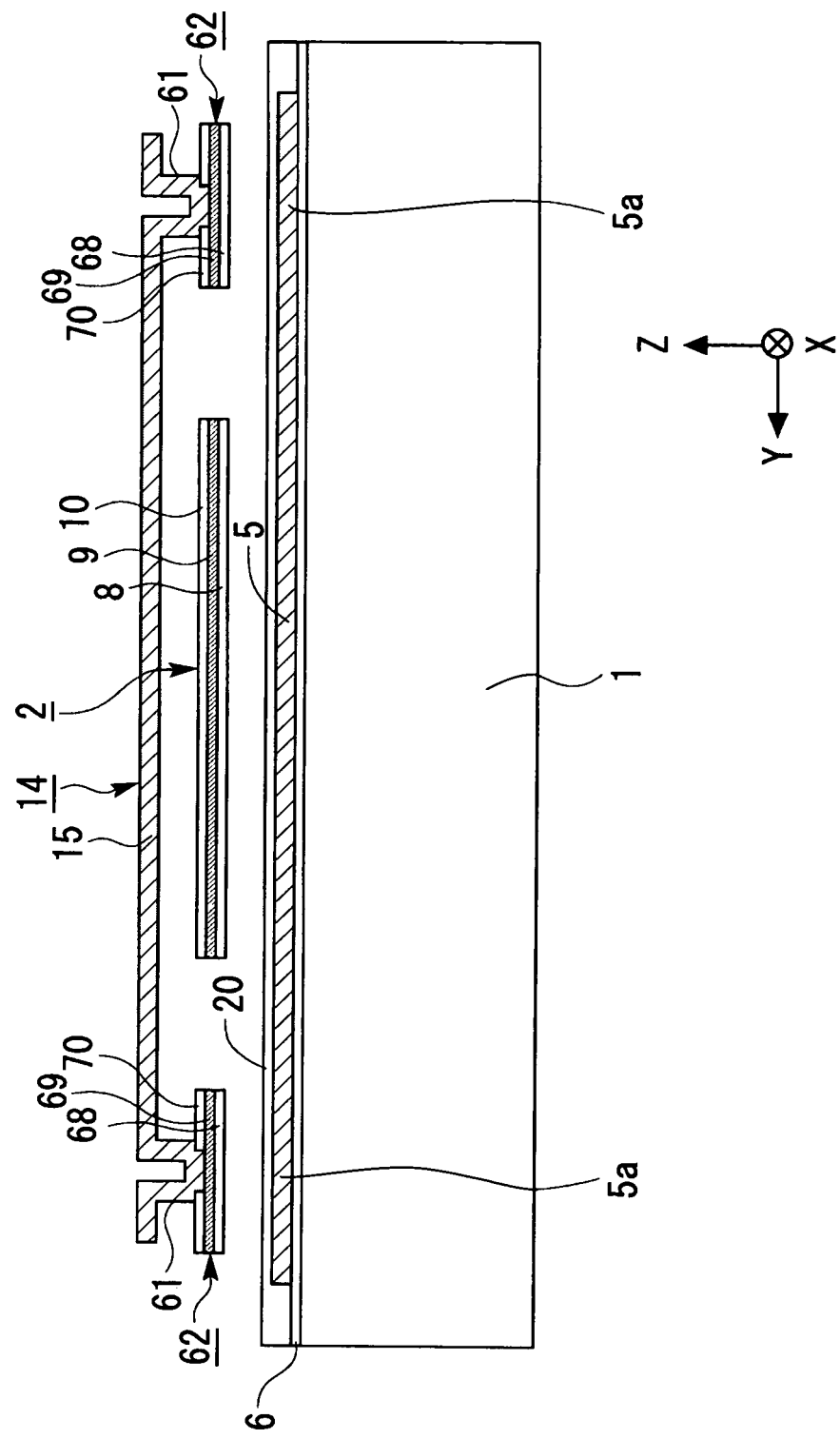
FIG. 19 shows a schematic sectional view taken along a line XIX-XIX (XXII-XXII) shown in FIG. 17, illustrating the same state as that of FIG. 18.
Figure 20:
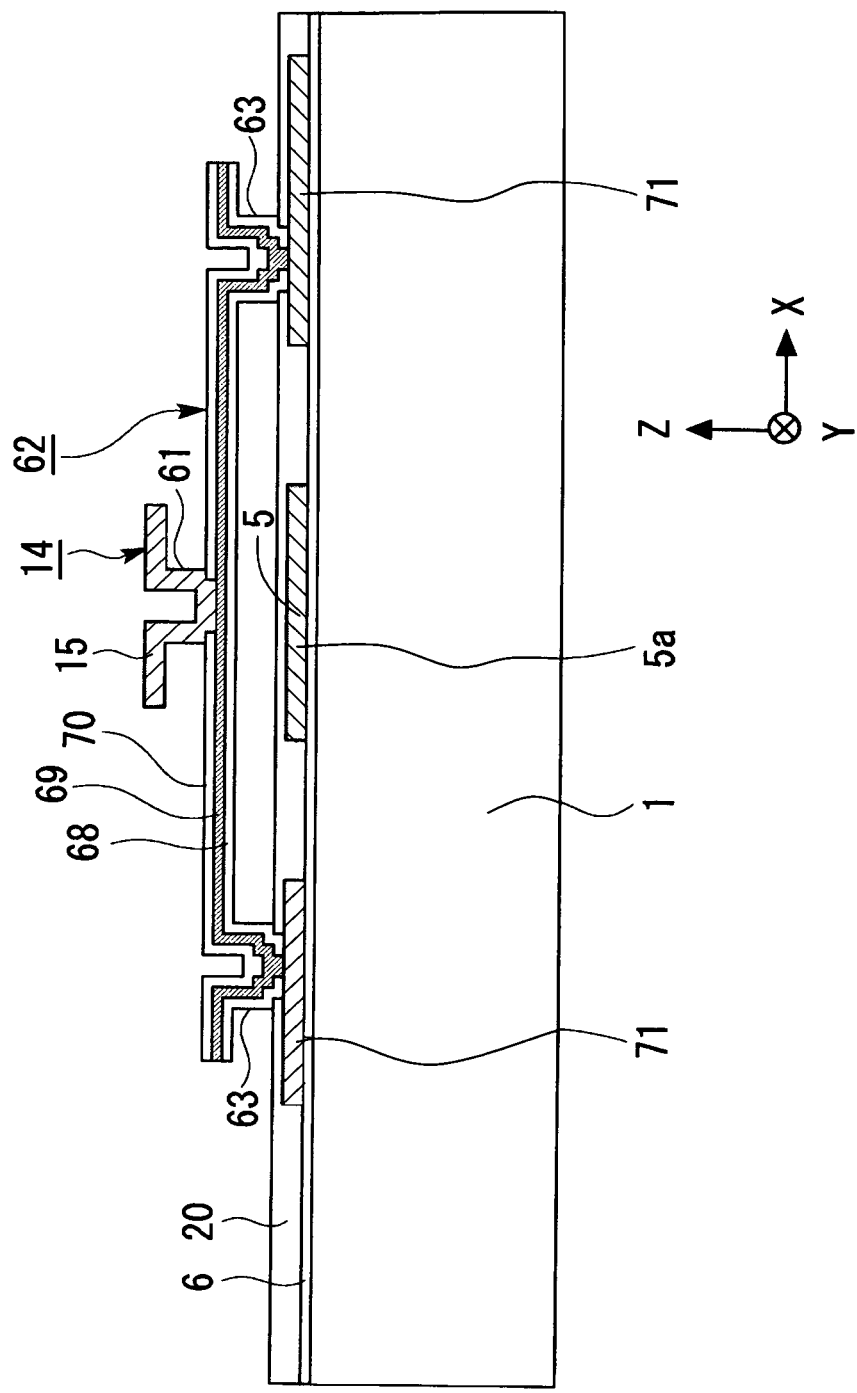
FIG. 20 shows a schematic sectional view taken along a line XX-XX (XXIII-XXIII) shown in FIG. 17, illustrating the same state as that of FIG. 18.
Figure 21:
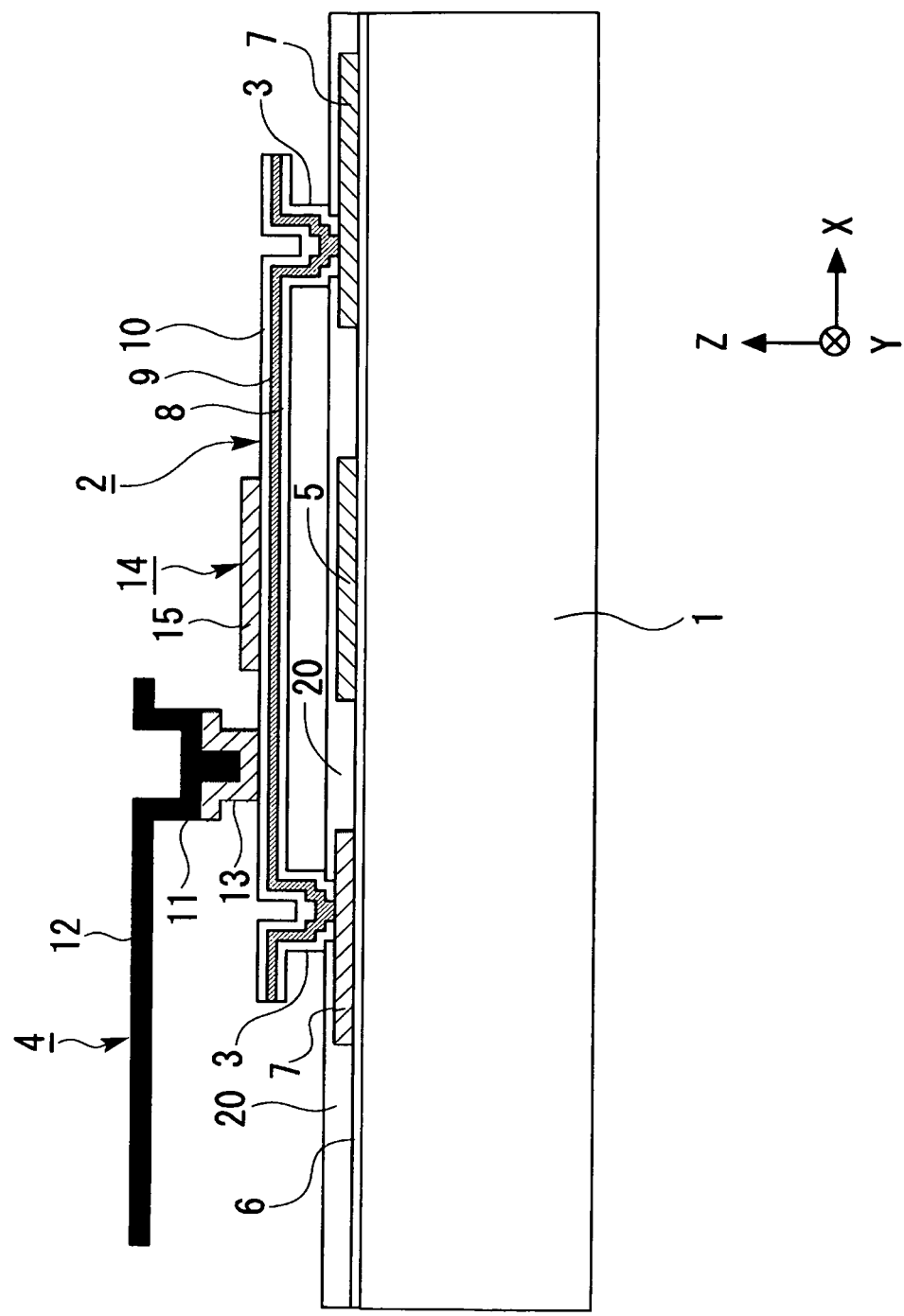
FIG. 21 shows a schematic sectional view taken along the line XVIII-XVIII (XXI-XXI) shown in FIG. 17, illustrating another state.
Figure 22:
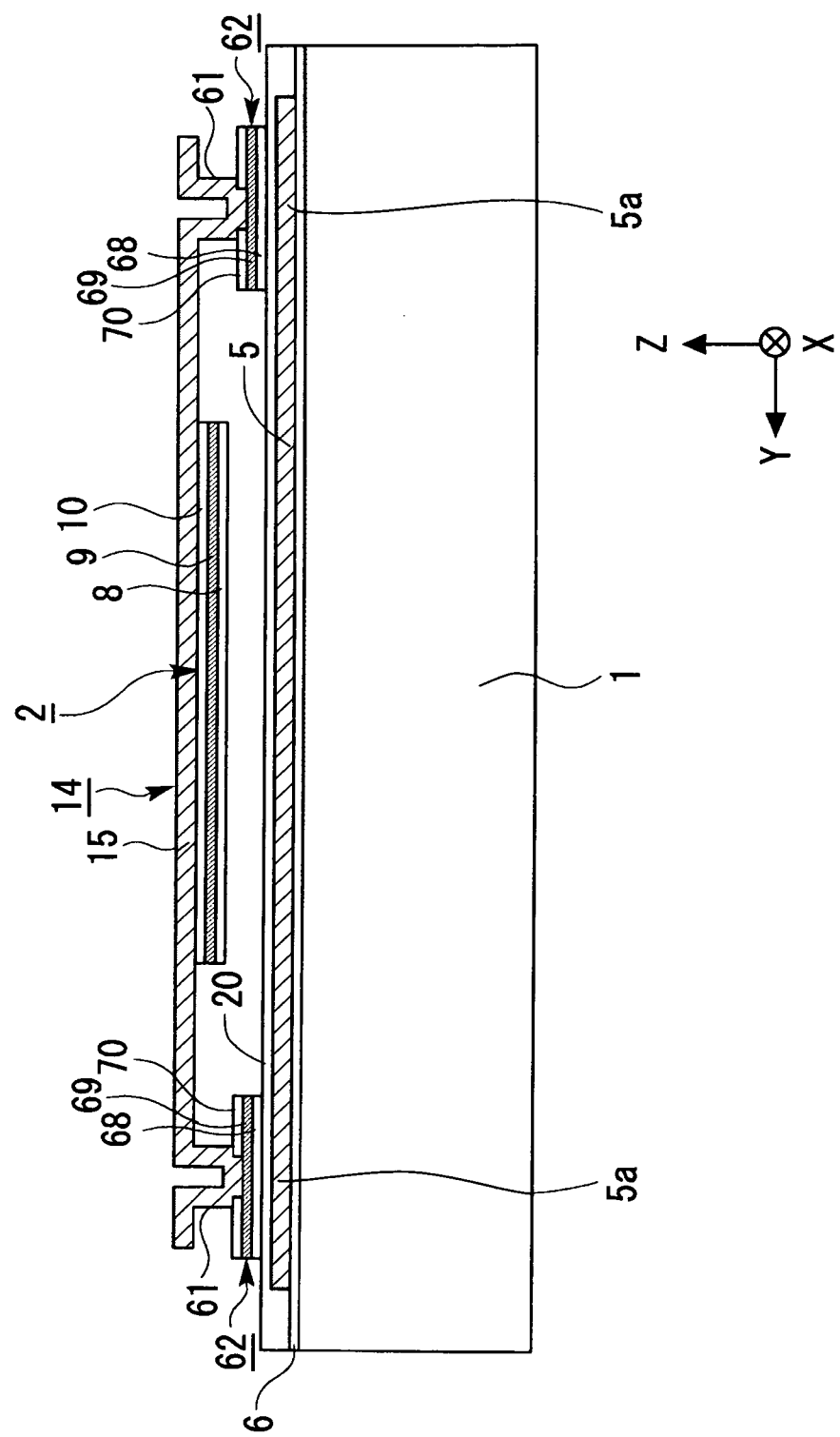
FIG. 22 shows a schematic sectional view taken along the line XIX-XIX (XXII-XXII) shown in FIG. 17, illustrating the same state as that of FIG. 21.
Figure 23:
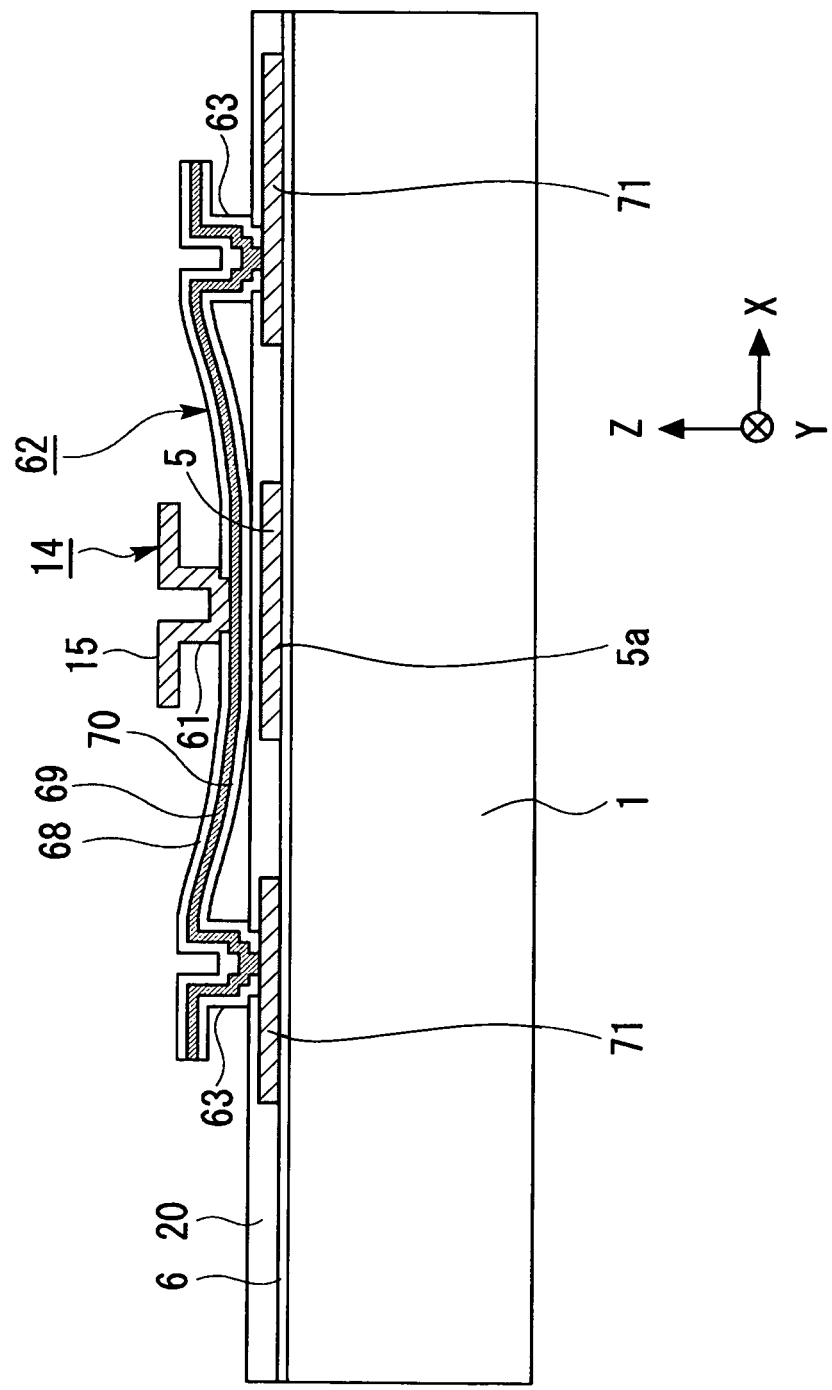
FIG. 23 shows a schematic sectional view taken along the line XX-XX (XXIII-XXIII) shown in FIG. 17, illustrating the same state as that of FIG. 21.

FIG. 16 shows a schematic perspective view schematically illustrating a unit element of an optical device according to a fifth embodiment of the present invention, and corresponds to FIG. 1. FIG. 17 shows a schematic plan view schematically illustrating the unit element shown in FIG. 16, and corresponds to FIG. 2. FIG. 18 shows a schematic sectional view taken along a line XVIII-XVIII (XXI-XXI) shown in FIG. 17. FIG. 19 shows a schematic sectional view taken along a line XIX-XIX (XXII-XXII) shown in FIG. 17. FIG. 20 shows a schematic sectional view taken along a line XX-XX (XXIII-XXIII) shown in FIG. 17. FIGS. 16 to 20 show a state before the use (state before a beam member 14 is positioned at a position during the use, in which the driving force is not generated). FIG. 21 also shows a schematic sectional view taken along the line XVIII-XVIII (XXI-XXI) shown in FIG. 17. FIG. 22 also shows a schematic sectional view taken along the line XIX-XIX (XXII-XXII) shown in FIG. 17. FIG. 23 also shows a schematic sectional view taken along the line XX-XX (XXIII-XXIII) shown in FIG. 17. FIGS. 21 to 23 show a predetermined state during the use (state in which an upward driving force is generated and the beam member 14 is positioned at the position during the use, which is same as a state shown in FIG. 24A described later on). In FIGS. 16 to 23, the elements, which are same as or correspond to the elements shown in FIGS. 1 to 5, are designated by the same reference numerals, any duplicate explanation of which will be omitted.

The optical device according to this embodiment is basically different from the optical device according to the first embodiment described above in that the optical device according to this embodiment is provided with a positioning mechanism which positions the beam member 14 to the position shown in FIGS. 21 to 23 by changing the position in the Z axis direction of the beam member 14 from the position shown in FIGS. 18 to 20 to the position shown in FIGS. 21 to 23, as compared with the first embodiment described above in which the beam member 14 is fixed to the substrate 1 via the legs 16 and the position of the beam member 14 is unchangeable or constant. In this embodiment, the position of the beam member 14 is changed to the predetermined position with respect to the substrate 1 (position shown in FIGS. 21 to 23) from the another position (position shown in FIGS. 18 to 20) by the positioning mechanism. Therefore, the beam member 14 is a position-changeable member or a positioning objective member to be positioned.

In this embodiment, the positioning mechanism has two deflectable support beam members 62 which support the beam member 14 at a portion disposed in the vicinity of the +Y side end portion and a portion disposed in the −Y side end portion of the beam member 14 respectively. Each of the support beam members 62 is constructed of a thin film to have a band-shaped plate form so that each of the support beam members 62 extends in the X axis direction. Each of the support beam members 62 is constructed of a three-layered film obtained by stacking a silicon nitride film 68 as a lower insulating film, an intermediate aluminum film 69, and an upper silicon nitride film 70.

Each of the support beam members 62 is fixed to the substrate 1 via a pair of legs 63 which rise from the substrate 1 via a planarizing film 20 and wiring pattern portions 71 (see FIGS. 20 and 23, omitted from FIGS. 16 and 17) each of which is constructed of an aluminum film formed on an insulating film 6 such as a silicon oxide film or the like on the substrate 1, in the vicinity of the +X side end portion and in the vicinity of the −X side end portion. Therefore, in this embodiment, the support beam member 62 is a bridge beam. The leg 63 is formed such that the silicon nitride films 68, 70 and the aluminum film 69, which constitute the support beam member 62, extend while being bent toward the substrate 1. The aluminum film 69 is connected to the wiring pattern 71 via openings formed through the silicon nitride film 68 and the planarizing film 20 respectively at the leg 63.

The beam member 14 is fixed to the respective support beam members 62 via connecting portions 61 provided instead of the legs 3 in the vicinity of the +Y side end portion and in the vicinity of the −Y side end portion. The connecting portion 61 is constructed such that the aluminum film 15, which constitutes the beam member 14, extends while being bent toward the substrate 1. The aluminum film 15 is connected to the aluminum film 69 via an opening formed through the silicon nitride film 70 at the connecting portion 61. Therefore, the aluminum film 15 of the beam member 14 is connected to the wiring pattern 71 via the aluminum film 69.

The lower fixed electrode 5 is extended in the X axis direction to range over the portions disposed under or below the respective support beam members 62. Each of areas 5a, of the lower fixed electrode 5, which is opposite to or facing one of the support beam members 62 under or below one of the support beam members 62, defines one electrode (fifth electrode portion) which is provided to generate the electrostatic force in order to position the beam member 14 in the Z axis direction. Each of areas, of the aluminum film 69 constructing one of the support beam members 62, which is opposite to or facing one of the areas 5a of the lower fixed electrode 5, defines the other electrode (fourth electrode portion) which is provided to generate the electrostatic force in order to perform the positioning. By applying a relatively high voltage between these electrodes so as to generate a relatively large electrostatic force therebetween, then, as shown in FIG. 23, the central portion of the support beam member 62 is deflected downwardly until the central portion is pressed and held by the substrate 1. That is, the central portion is subjected to the pull-in toward the substrate 1. In this embodiment, the setting is made such that the beam member 14 is positioned at a position in the Z axis direction at which the beam member 14 is just brought in contact with the plate-shaped member 2 which is parallel to the substrate 1 in the pull-in state. That is, the bottom surface of the beam member 14 and the upper surface of the plate-shaped member 2 have a same height position. Therefore, the plate-shaped member 2 is constrained by the beam member 14, and the plate-shaped member 2 cannot be deflected upwardly. In this meaning, the beam member 14 functions as the constraint member. In this embodiment, the pull-in state is maintained during the use; and the position in the Z axis direction of the beam member 14 is continuously positioned at the position shown in FIGS. 21 to 23. It is preferable that the positioning is performed in the Z axis direction for the beam member 14 by utilizing the pull-in state as described above. However, it is also possible to make the setting such that the beam member 14 is positioned at the position in the Z axis direction at which the beam member 14 is just brought in contact with the plate-shaped member 2 which is parallel to the substrate 1 when the voltage between the electrodes is an appropriate voltage, without using the pull-in state.

In this embodiment, the support beam member 62 is the bridge beam as described above. However, the support beam member 62 may be, for example, a cantilever beam. In this embodiment, the structure or construction, which uses the electrostatic force, is adopted as the positioning mechanism described above. However, it is also allowable to adopt a positioning device which uses the Lorentz force or a positioning device which uses a piezoelectric element. For example, the support beam member 62 may be a rigid plate, and a piezoelectric element may be provided for the leg 63. The length of the leg can be adjusted by changing the voltage to be applied to the piezoelectric element.

Figures 24A, 24B:
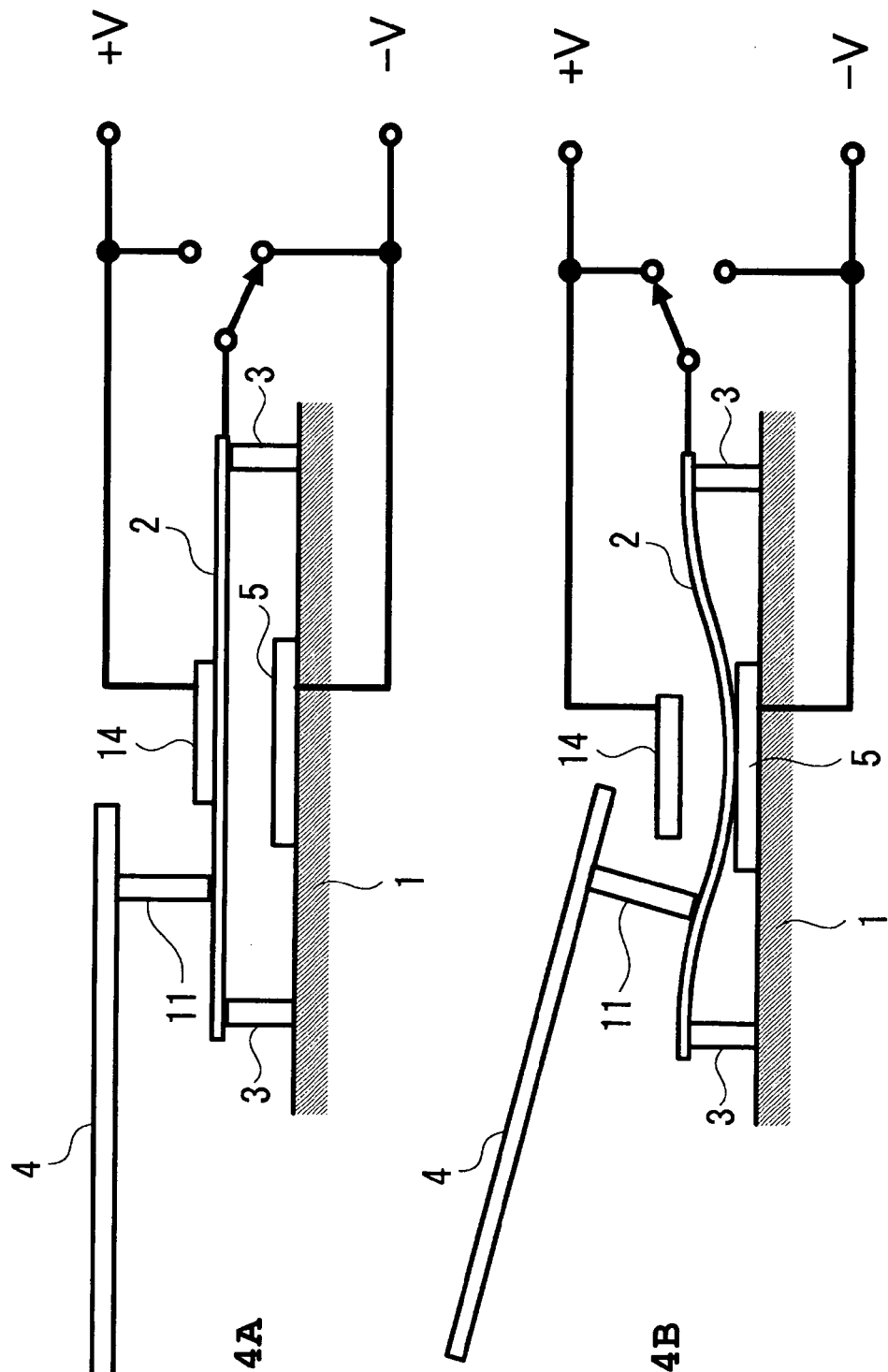
FIGS. 24A and 24B schematically show respective operation states of an optical device according to a fifth embodiment of the present invention.

FIG. 24 schematically shows respective operation states of the optical device according to this embodiment, and corresponds to sectional views as obtained by greatly simplifying FIG. 21. In this embodiment, as described above, the position in the Z axis direction of the beam member 14 is continuously positioned at the position shown in FIGS. 21 to 23 in any one of the state shown in FIG. 24A and the state shown in FIG. 24B during the use.

FIG. 24A shows, in the same manner as FIG. 6A, such a state that the electric potential −V is applied to the lower fixed electrode 5 and the movable electrode (area of the aluminum film 9 of the plate-shaped member 9 opposite to or facing the lower fixed electrode 5 and the upper fixed electrode) and the electric potential +V is applied to the upper fixed electrode (area of the aluminum film 15 of the beam member 14 opposite to or facing the aluminum film 9 of the plate-shaped member 2) so that the voltage between the lower fixed electrode 5 and the movable electrode is zero and the electrostatic force is not generated therebetween, while the relatively high voltage (2×V) is applied between the movable electrode and the upper fixed electrode so that the relatively large electrostatic force is generated therebetween. In this state, the plate-shaped member 2 is made to abut against or brought in contact with the beam member 14, and the plate-shaped member 2 stands still at the position of the abutment or contact. In this embodiment, unlike the first embodiment described above, the position in the Z axis direction of the beam member 14 is positioned at the position described above. Therefore, the plate-shaped member 2 is constrained by the beam member 14 from the upper position thereof. As a result, the plate-shaped member 2 maintains the posture parallel to the substrate; and the mirror 4 is parallel to the substrate 1 (first angle).

As shown in FIG. 24B (in the same manner as FIG. 6B), the electric potential +V is applied to the movable electrode and the upper fixed electrode and the electric potential −V is applied to the lower fixed electrode 5. Accordingly, the voltage between the movable electrode and the upper fixed electrode is zero and the electrostatic force is not generated therebetween, while the relatively high voltage (2×V) is applied between the movable electrode and the lower fixed electrode 5 so that the relatively large electrostatic force is generated therebetween. In this state, as shown in FIG. 24B, the plate-shaped member 2 is deformed until the abutment against or contact with the side of the substrate 1, and the plate-shaped member 2 stands still at the position of the abutment or contact. As a result, the mirror 4 is inclined with respect to the substrate 1 (at the second angle) in the same manner as in FIG. 6B. In view of this feature, the substrate 1, especially the lower fixed electrode 5 provided on the substrate can be regarded as the constraint member for the plate-shaped member 2 (or the mirror 4).

In the first embodiment described above, the beam member 14 is fixed to the substrate 1. Therefore, the beam member 14 is positioned over or above the plate-shaped member 2 in the Z axis direction while being separated (away) by the constant spacing distance therefrom. If a gap between the beam member 14 and the plate-shaped member 2 (gap corresponding to the sacrifice layer 22) can be eliminated, i.e., if the beam member 14 and the plate-shaped member 2 can be arranged at a same height (at the same position in the Z axis direction), then it is possible to fix the mirror 4 at the horizontal position (position parallel to the substrate 1). However, in the production process based on the photolithography as used in the first embodiment, it is difficult to allow the beam member 14 and the plate-shaped member 2 to have the same height (the same position in the Z axis direction), i.e., it is difficult to form the beam member 14 and the plate-shaped member 2 without providing any gap. According to this embodiment, the beam member 14 is formed so that the beam member 14 is positioned over or above the plate-shaped member 2 while being separated by the constant spacing distance in the Z axis direction from the plate-shaped member 2, and the beam member 14 is subjected to the change to have the same height as that of the plate-shaped member 2 by using the deformable support beam members 62. Therefore, as shown in FIG. 24A, the mirror 4 can be fixed at the horizontal position. Therefore, it is possible to realize the arrangement in which the beam member 14 and the plate-shaped member 2 are arranged without providing any gap, without complicating the production process as well. Further, the optical device of this embodiment is effective for such a way of use that it is intended to change especially the mirror 4 from the horizontal position to the inclined position or reversely thereto. As for the other features, the advantage, which is the same as or equivalent to that of the first embodiment described above, is also obtained in accordance with this embodiment.

Figure 25A:
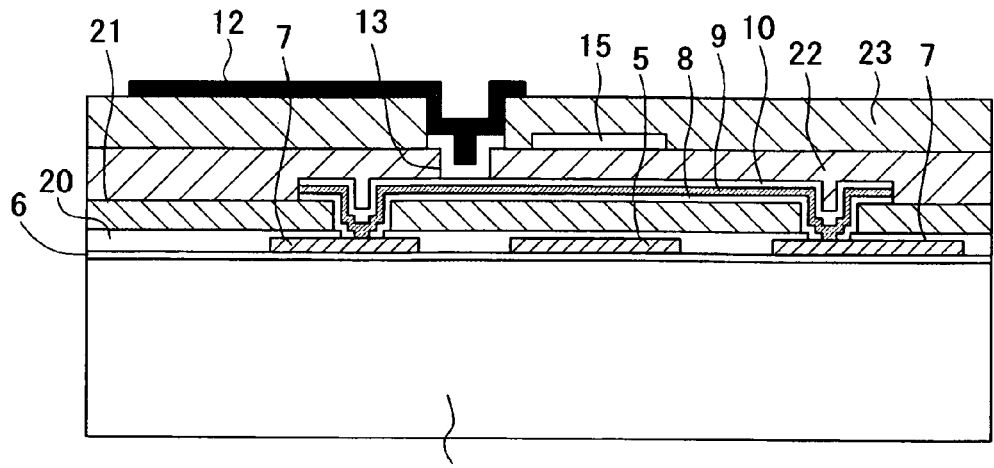
FIGS. 25A to 25C show steps of a method for producing the optical device according to the fifth embodiment of the present invention.
Figure 25B:
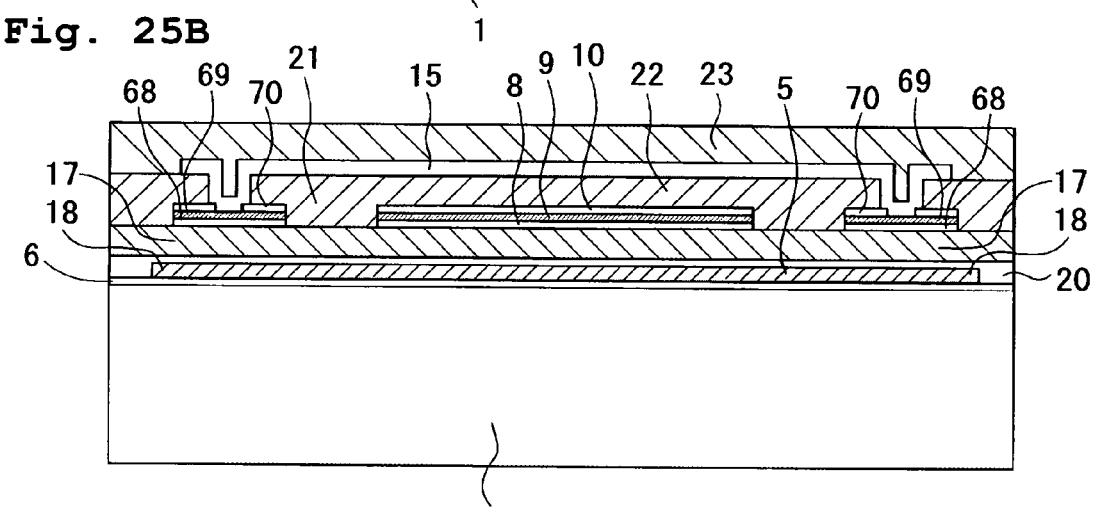
Figure 25C:
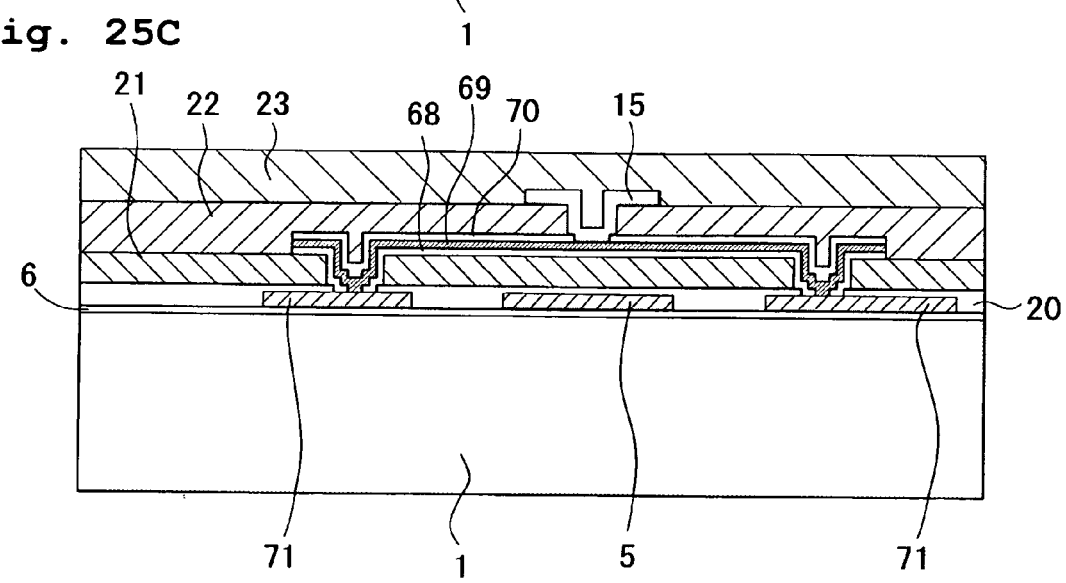

The optical device according to this embodiment can be also produced by utilizing the technique for producing the semiconductor including, for example, the film formation, the patterning, the etching, and the formation and removal of the sacrifice layer, in the same manner as the optical device according to the first embodiment described above. FIG. 25 shows sectional views illustrating steps to be performed immediately before the removal of the sacrifice layers 21 to 23. FIG. 25A corresponds to FIG. 18, FIG. 25B corresponds to FIG. 19, and FIG. 25C corresponds to FIG. 20.

Sixth Embodiment

Figure 26:
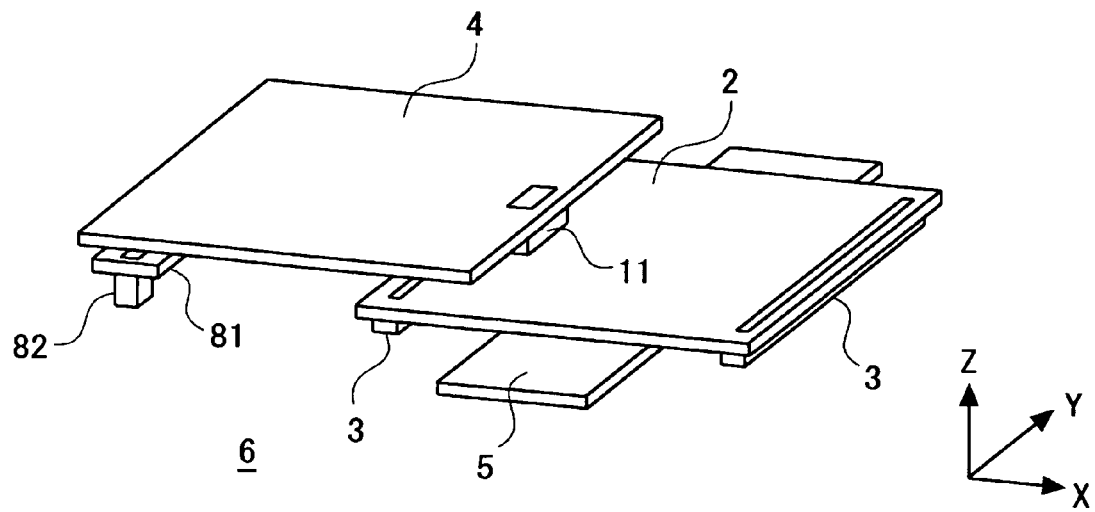
FIG. 26 schematically shows a unit element of an optical device according to a sixth embodiment of the present invention.
Figure 27:
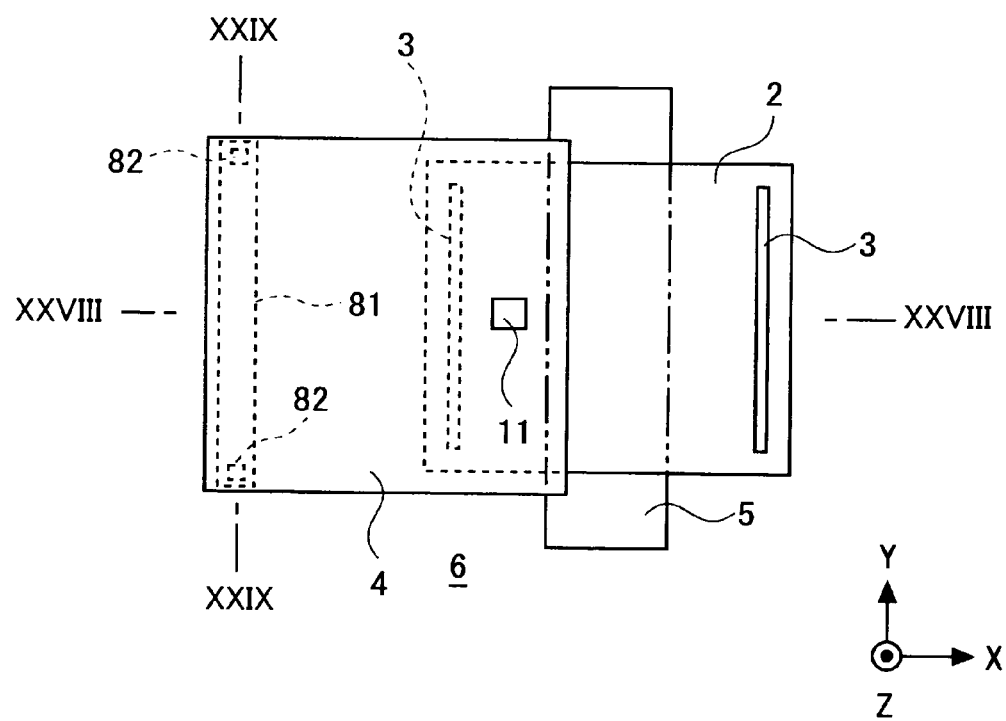
FIG. 27 shows a schematic plan view schematically illustrating the unit element shown in FIG. 26.
Figure 28:
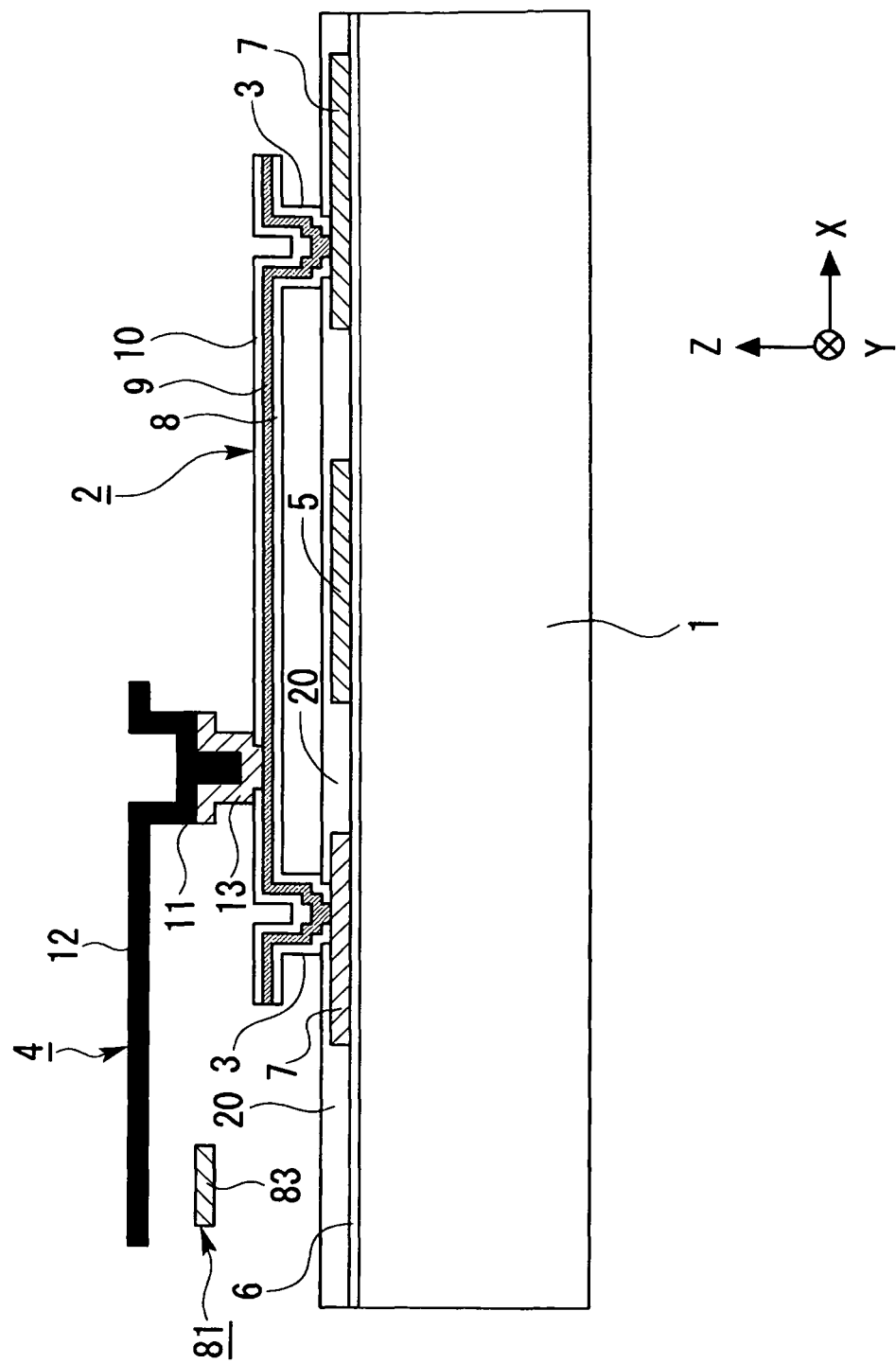
FIG. 28 shows a schematic sectional view taken along a line XXVIII-XXVIII shown in FIG. 27.

FIG. 26 shows a schematic perspective view schematically illustrating a unit element of an optical device according to a sixth embodiment of the present invention, and corresponds to FIG. 1. FIG. 27 shows a schematic plan view schematically illustrating the unit element shown in FIG. 26, and corresponds to FIG. 2. FIG. 28 shows a schematic sectional view taken along a line XXVIII-XXVIII shown in FIG. 27. FIG. 29 shows a schematic sectional view taken along a line XXIX-XXIX shown in FIG. 27. In FIGS. 26 to 29, the elements, which are same as or correspond to the elements shown in FIGS. 1 to 5, are designated by the same reference numerals, any duplicate explanation of which will be omitted.

The optical device according to this embodiment is basically different from the optical device according to the first embodiment described above in that the beam member 14, which is arranged over or above the plate-shaped member 2, is removed and a beam member 81 is provided instead thereof and in that the aluminum film 13 is connected to the aluminum film 9 via an opening formed through the silicon nitride film 10 at the connecting portion 11.

The beam member 81 is arranged on the lower side of (under or below) the mirror 4 in the vicinity of one side or edge of the mirror 4 on the −X side, the mirror 4 being the driving objective as the member fixed to the plate-shaped member 2. The beam member 81 is constructed of a thin film. The beam member 81 is constructed of an aluminum film 83. The beam member 81 is provided as another fixed electrode (third electrode portion). The beam member 81 is fixed to the substrate 1 via legs 82 which rise from the substrate 1 via wiring pattern portions 85 (see FIG. 29, omitted from FIGS. 26 and 27), each of which is constructed of an aluminum film formed on the insulating film 6 on the substrate 1, in the vicinity of a +Y side end portion and in the vicinity of a −Y side end portion. Accordingly, the beam member 81 is the member which is fixed to the substrate 1. The leg 82 is constructed of an aluminum film 83 which extends while being bent toward the substrate 1 from the beam member 81, and an aluminum film 84 which covers lower and side portions thereof. The aluminum film 84 is connected to a wiring pattern 85 via an opening formed through the planarizing film 20 at the leg 82. The area of the aluminum film constructing the mirror 4, which is opposite to or facing the beam member 81, is an electrode (fourth electrode portion) which is capable of generating the electrostatic force between the electrode and the beam member 81. The connecting portion 11 of the mirror 4 is formed by the aluminum films 12, 13 as described above. The connecting portion 11 is connected to the aluminum film 12 of the plate-shaped member 12. Therefore, the connecting portion 11 is also electrically connected to the wiring pattern 7.

FIG. 30 (FIGS. 30A, 30B) schematically shows respective operation states of the optical device according to this embodiment, and corresponds to sectional views as obtained by greatly simplifying FIG. 28.

As shown in FIG. 30A, the electric potential −V is applied to the lower fixed electrode 5, the movable electrode (area of the aluminum film 9 of the plate-shaped member 9 opposite to or facing the lower fixed electrode 5) and the electrode formed by the part of the mirror 4, and the electric potential +V is applied to the beam member 81. Accordingly, the voltage between the lower fixed electrode 5 and the movable electrode is zero and the electrostatic force is not generated therebetween, while the relatively high voltage (2×V) is applied between the electrode formed by the part of the mirror 4 and the beam member 81 so that the relatively large electrostatic force is generated therebetween. In this state, the electrode formed by the part of the mirror 4 is attracted by the beam member 81. Therefore, as shown in FIG. 30A, the plate-shaped member 2 is deformed until the mirror 4 abuts against (contacts with) the beam member 81, and the plate-shaped member 2 stands still at a position of the abutment (contact). That is, the mirror 4 is constrained horizontally by the beam member 81 on the lower side thereof. As a result, the mirror 4 is horizontal with respect to the substrate 1. In this viewpoint, the beam member 81 can be regarded as the constraint member for the mirror 4 (or the plate-shaped member 2).

As shown in FIG. 30B, the electric potential +V is applied to the movable electrode, the electrode formed by the part of the mirror 4 and the beam member 81, and the electric potential −V is applied to the lower fixed electrode 5. Accordingly, the voltage between the electrode formed by the part of the mirror 4 and the beam member 81 is zero and the electrostatic force is not generated therebetween, while the relatively high voltage (2×V) is applied between the movable electrode and the lower fixed electrode 5 so that the relatively large electrostatic force can be generated therebetween. In this state, the plate-shaped member 2 is deformed until the abutment against (contact with) the side of the substrate 1, and the plate-shaped member 2 stands still at a position of the abutment (contact). As a result, the mirror 4 is inclined with respect to the substrate 1. In this viewpoint, the substrate 1, especially the lower fixed electrode 5 provided on the substrate can be regarded as the constraint member for the plate-shaped member 2 (or the mirror 4).

The optical device of this embodiment is effective for such a way of use that it is intended to change the mirror 4 from the horizontal position to the inclined position or reversely thereto, in the same manner as the optical device of the fifth embodiment. The lower fixed electrode 5 is installed in the lower space disposed under or below the mirror 4, and hence the degree of freedom is increased in the upper space disposed over or above the plate-shaped member 2. Further, the advantage, which is same as or equivalent to that of the first embodiment described above, is also obtained.

Figure 31A:
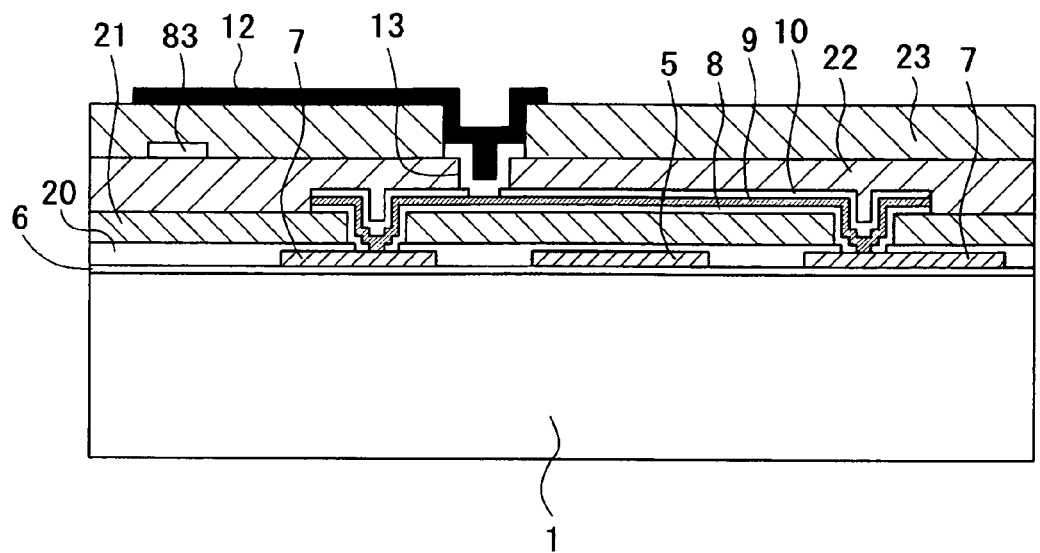
FIGS. 31A and 31B show steps of a method for producing the optical device according to the sixth embodiment of the present invention.
Figure 31B:
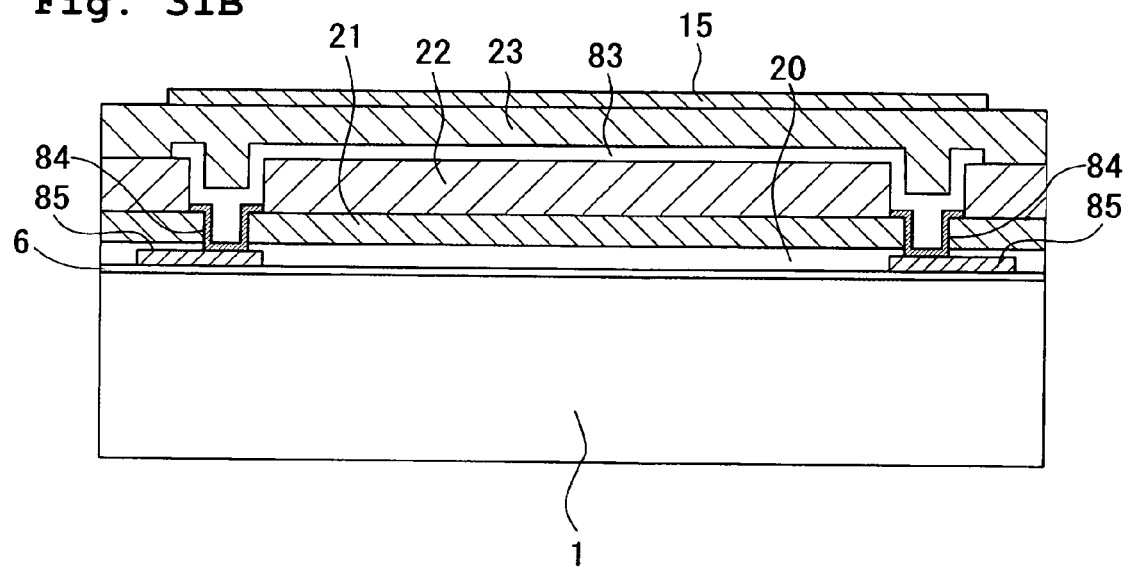

The optical device according to this embodiment can be also produced by utilizing the technique for producing the semiconductor including the film formation, the patterning, the etching, and the formation, removal of the sacrifice layer, etc., in the same manner as the optical device according to the first embodiment described above. FIG. 31 (FIGS. 31A, 31B) shows sectional views illustrating steps to be performed immediately before the removal of the sacrifice layers 21 to 23. FIG. 31A corresponds to FIG. 28, and FIG. 31B corresponds to FIG. 29.

The respective embodiments of the present invention have been explained above. However, the present invention is not limited to the embodiments.

For example, the optical device according to any one of the fourth to sixth embodiments may be adopted for the apparatus according to the second or third embodiment, instead of the optical device according to the first embodiment. The materials of the members constructing the optical device can be changed to arbitrary materials with which the present invention can be carried out.

The US patent documents or the US patent application publications are described in this specification, which are incorporated herein by reference within a range of permission of the domestic laws and ordinances of the designated state or the selected state of this international application.

The microactuator according to the embodiment of the present invention and the optical device and the display apparatus provided with the same can be driven at high speed, wherein only the direction can be changed without deforming the optical element itself. Therefore, the present invention is applicable to the ways of use in a wide range. Therefore, the exposure apparatus according to the embodiment of the present invention, makes it possible to produce a high-perfor-

What is claimed is:

1. A microactuator which drives a driving objective, the microactuator comprising:
a base member;
a plate-shaped member which is deflectively deformable and which is supported by the base member; and
a driving force applying device which applies a driving force to the driving objective;
wherein the plate-shaped member is fixed to the base member at a predetermined place and the plate-shaped member is deflectively deformable in a deflectively deformable area which is different from the predetermined place of the plate-shaped member;
the driving objective is connected to a predetermined portion of the deflectively deformable area of the plate-shaped member on one side of the plate-shaped member, the base member being arranged on the other side of the plate-shaped member;
the driving force applying device deflectively deforms the deflectively deformable area of the plate-shaped member to change an inclination of the predetermined portion of the plate-shaped member between a first inclination and a second inclination; and
a part of the plate-shaped member or a part of a member fixed to the plate-shaped member is brought into abutment against a member which is different from the base member and which is different from the driving objective when the inclination of the predetermined portion is the first inclination, and the part of the plate-shaped member or the part of the member fixed to the plate-shaped member is brought into abutment against the base member when the inclination of the predetermined portion is the second inclination.

2. The microactuator according to claim 1, wherein the plate-shaped member is fixed to the base member at the predetermined place located on an entire circumference or a part of the circumference at a circumferential portion of the plate-shaped member and the plate-shaped member is deflectively deformable in the deflectively deformable area different from the predetermined place of the plate-shaped member; the predetermined place includes mutually opposing two places at the circumferential portion of the plate-shaped member; the driving objective is mechanically connected locally to the predetermined portion of the plate-shaped member; and the member, which is different from the base member and which is different from the driving objective, is a member which is fixed to the base member or a position-changeable member which is provided displaceably with respect to the base member.

3. The microactuator according to claim 2, wherein the member, which is fixed to the plate-shaped member, is the driving objective.

4. The microactuator according to claim 2, wherein the driving objective has a principal plane, and a principal plane of the plate-shaped member is substantially parallel to the principal plane of the driving objective.

5. The microactuator according to claim 2, wherein the predetermined portion of the plate-shaped member is a portion which is disposed eccentrically from a center of gravity of the plate-shaped member.

6. The microactuator according to claim 2, wherein the driving force applying device includes a first electrode portion which is provided on the plate-shaped member, a second electrode portion which is arranged on one side of the first electrode portion and which generates an electrostatic force between the first electrode portion and the second electrode portion by a voltage between the first electrode portion and the second electrode portion, and a third electrode portion which is arranged on the other side of the first electrode portion and which generates an electrostatic force between the first electrode portion and the third electrode portion by a voltage between the first electrode portion and the third electrode portion;
the second electrode portion is provided on the base member; and
the third electrode portion is provided on the member which is fixed to the base member.

7. The microactuator according to claim 2, wherein
the part of the plate-shaped member is brought into abutment against the position-changeable member when the inclination of the predetermined portion is the first inclination;
the driving force applying device includes a first electrode portion which is provided on the plate-shaped member, a second electrode portion which is arranged on one side of the first electrode portion and which generates an electrostatic force between the first electrode portion and the second electrode portion by a voltage between the first electrode portion and the second electrode portion, and a third electrode portion which is arranged on the other side of the first electrode portion and which generates an electrostatic force between the first electrode portion and the third electrode portion by a voltage between the first electrode portion and the third electrode portion;
the second electrode portion is provided on the base member;
the third electrode portion is provided on the position-changeable member; and
the microactuator further comprises a positioning mechanism which positions the position-changeable member to change a position of the position-changeable member to a predetermined position from a position different from the predetermined position.

8. The microactuator according to claim 7, wherein the driving objective has a principal plane, and the principal plane of the driving objective is substantially parallel to a principal plane of the base member when the inclination of the predetermined portion is the first inclination brought about by the driving force.

9. The microactuator according to claim 7, wherein the positioning mechanism includes a deflectable member which is supported by the base member, a fourth electrode portion which is provided on the deflectable member, and a fifth electrode portion which is provided on the base member and which generates an electrostatic force between the fourth electrode portion and the fifth electrode portion by a voltage between the fourth electrode portion and the fifth electrode portion.

10. The microactuator according to claim 1, wherein
the driving force applying device includes a first electrode portion which is provided on the plate-shaped member, a second electrode portion which is provided on the base member and which generates an electrostatic force between the first electrode portion and the second electrode portion by a voltage between the first electrode portion and the second electrode portion, and a third electrode portion;
the driving objective has a fourth electrode portion; and the third electrode portion generates an electrostatic force between the third electrode portion and the fourth electrode portion by a voltage between the third electrode portion and the fourth electrode portion.

11. An optical device comprising the microactuator as defined in claim 1, wherein the driving objective is an optical element.

12. The optical device according to claim 11, wherein the optical element is a mirror.

13. The optical device according to claim 11, wherein the optical device comprises a plurality of sets of the microactuator and the optical element.

14. A display apparatus comprising a spatial optical modulator, wherein the spatial optical modulator is the optical device as defined in claim 13.

15. An exposure apparatus which exposes an object by using an illumination light, the exposure apparatus comprising the optical device as defined in claim 13 which is arranged on an optical path of the illumination light;
wherein the object is exposed with the illumination light via the optical device.

16. The exposure apparatus according to claim 15, wherein the optical device generates a predetermined pattern by being irradiated with the illumination light.

17. The exposure apparatus according to claim 15, further comprising a movable member which is movable while holding the object;
wherein the driving force applying device of each of the microactuators of the optical device is controlled in synchronization with movement of the movable member in a predetermined direction.

18. A method for producing a device, comprising a lithography step, wherein the lithography step includes exposing a substrate by using the exposure apparatus as defined in claim 15, and processing the exposed substrate after being developed.

19. An optical device comprising:
a base member;
a flexible plate which is supported on the base member deflectively deformably;
an optical element which is connected to the flexible plate on one side of the flexible plate, the base member being arranged on the other side of the flexible plate;
a first electrode which is provided on the flexible plate;
a second electrode which is provided on the base member;
a third electrode which is provided at a position different from those of the base member and the flexible plate; and
a constraint member which constrains displacement of the optical element or the flexible plate;
wherein when a first voltage is applied between the first electrode and the second electrode to generate an electrostatic force between the first electrode and the second electrode, the flexible plate is deflected toward the base member and the flexible plate is constrained by the base member so that the optical element is arranged at a second angle by the electrostatic force generated between the first electrode and the second electrode, and when a second voltage is applied between the first electrode and the third electrode to generate an electrostatic force between the first electrode and the third electrodes, the optical element or the flexible plate is constrained by the constraint member so that the optical element is arranged at a first angle by the electrostatic force generated between the first electrode and the third electrode.

20. The optical device according to claim 19, wherein the constraint member is provided on a side of the flexible member opposite to the base member; the third electrode is provided on the constraint member; and a direction in which the flexible plate is deflected when the first voltage is applied between the first electrode and the second electrode is opposite to a direction in which the flexible plate is deflected when the second voltage is applied between the first electrode and the third electrode.

21. The optical device according to claim 19, further comprising a mechanism which is connected to the constraint member and which changes a position of the constraint member with respect to the flexible plate.

22. The optical device according to claim 21, wherein the constraint member is displaced by the mechanism to a position at which the constraint member is brought in contact with the flexible plate.

23. The optical device according to claim 21, wherein the third electrode is provided on the constraint member; and the flexible plate is constrained by the constraint member so that the optical element is arranged to be parallel to the base member by the electrostatic force generated between the first electrode and the third electrode when the second voltage is applied between the first electrode and the third electrode.

24. The optical device according to claim 19, wherein the third electrode is provided on the constraint member; and the optical element is constrained by the constraint member so that the optical element is arranged to be parallel to the base member by the electrostatic force generated between the first electrode and the third electrode when the second voltage is applied between the first electrode and the third electrode.

25. The optical device according to claim 19, wherein a part of the optical element and the first electrode are electrically connected to each other; and a direction in which the flexible plate is deflected when the first voltage is applied between the first electrode and the second electrode is same as a direction in which the flexible plate is deflected when the second voltage is applied between the first electrode and the third electrode.

26. A display apparatus comprising a spatial optical modulator, wherein the spatial optical modulator is the optical device as defined in claim 19.

27. An exposure apparatus which exposes an object by using an illumination light, the exposure apparatus comprising the optical device as defined in claim 19 which is arranged on an optical path of the illumination light;
wherein the object is exposed with the illumination light via the optical device.

28. The exposure apparatus according to claim 27, wherein the optical device generates a predetermined pattern by being irradiated with the illumination light.

29. A method for producing a device, comprising a lithography step, wherein the lithography step includes exposing a substrate by using the exposure apparatus as defined in claim 27, and processing the exposed substrate after being developed.

30. The optical device according to claim 19, wherein the optical member is not deformed when the flexible plate is deformed between the second electrode and the third electrode.

31. A microactuator which drives a driving objective, the microactuator comprising:
a base member;
a plate-shaped member which is deflectively deformable and which is supported by the base member; and
a driving force applying device which applies a driving force to the driving objective;
wherein the plate-shaped member is fixed to the base member at a predetermined place and the plate-shaped member is deflectively deformable in a deflectively deformable area which is different from the predetermined place of the plate-shaped member;

the driving objective is connected to a predetermined portion of the deflectively deformable area of the plate-shaped member;

the driving force applying device deflectively deforms the deflectively deformable area of the plate-shaped member to change an inclination of the predetermined portion of the plate-shaped member between a first inclination and a second inclination;

a part of the plate-shaped member or a part of a member fixed to the plate-shaped member is brought into abutment against a member which is different from the base member when the inclination of the predetermined portion is the first inclination, and the part of the plate-shaped member or the part of the member fixed to the plate-shaped member is brought into abutment against the base member when the inclination of the predetermined portion is the second inclination;

the plate-shaped member is fixed to the base member at the predetermined place located on an entire circumference or a part of the circumference at a circumferential portion of the plate-shaped member and the plate-shaped member is deflectively deformable in the deflectively deformable area different from the predetermined place of the plate-shaped member; the predetermined place includes mutually opposing two places at the circumferential portion of the plate-shaped member; the driving objective is mechanically connected locally to the predetermined portion of the plate-shaped member; and the member, which is different from the base member, is a member which is fixed to the base member or a position-changeable member which is provided displaceably with respect to the base member;

the part of the plate-shaped member is brought into abutment against the position-changeable member when the inclination of the predetermined portion is the first inclination;

the driving force applying device includes a first electrode portion which is provided on the plate-shaped member, a second electrode portion which is arranged on one side of the first electrode portion and which generates an electrostatic force between the first electrode portion and the second electrode portion by a voltage between the first electrode portion and the second electrode portion, and a third electrode portion which is arranged on the other side of the first electrode portion and which generates an electrostatic force between the first electrode portion and the third electrode portion by a voltage between the first electrode portion and the third electrode portion;

the second electrode portion is provided on the base member;

the third electrode portion is provided on the position-changeable member; and the microactuator further comprises a positioning mechanism which positions the position-changeable member to change a position of the position-changeable member to a predetermined position from a position different from the predetermined position.

32. The microactuator according to claim 31, wherein the driving objective has a principal plane, and the principal plane of the driving objective is substantially parallel to a principal plane of the base member when the inclination of the predetermined portion is the first inclination brought about by the driving force.

33. The microactuator according to claim 31, wherein the positioning mechanism includes a deflectable member which is supported by the base member, a fourth electrode portion which is provided on the deflectable member, and a fifth electrode portion which is provided on the base member and which generates an electrostatic force between the fourth electrode portion and the fifth electrode portion by a voltage between the fourth electrode portion and the fifth electrode portion.

34. A microactuator which drives a driving objective, the microactuator comprising:
   a base member;
   a plate-shaped member which is deflectively deformable and which is supported by the base member; and
   a driving force applying device which applies a driving force to the driving objective;
   wherein the plate-shaped member is fixed to the base member at a predetermined place and the plate-shaped member is deflectively deformable in a deflectively deformable area which is different from the predetermined place of the plate-shaped member;
   the driving objective is connected to a predetermined portion of the deflectively deformable area of the plate-shaped member;
   the driving force applying device deflectively deforms the deflectively deformable area of the plate-shaped member to change an inclination of the predetermined portion of the plate-shaped member between a first inclination and a second inclination;
   a part of the plate-shaped member or a part of a member fixed to the plate-shaped member is brought into abutment against a member which is different from the base member when the inclination of the predetermined portion is the first inclination, and the part of the plate-shaped member or the part of the member fixed to the plate-shaped member is brought into abutment against the base member when the inclination of the predetermined portion is the second inclination;
   the driving force applying device includes a first electrode portion which is provided on the plate-shaped member, a second electrode portion which is provided on the base member and which generates an electrostatic force between the first electrode portion and the second electrode portion by a voltage between the first electrode portion and the second electrode portion, and a third electrode portion;
   the driving objective has a fourth electrode portion; and
   the third electrode portion generates an electrostatic force between the third electrode portion and the fourth electrode portion by a voltage between the third electrode portion and the fourth electrode portion.

35. An optical device comprising:
   a base member;
   a flexible plate which is supported on the base member deflectively deformably;
   an optical element which is connected to the flexible plate;
   a first electrode which is provided on the flexible plate;
   a second electrode which is provided on the base member;
   a third electrode which is provided at a position different from those of the base member and the flexible plate;
   a constraint member which constrains displacement of the optical element or the flexible plate; and
   a mechanism which is connected to the constraint member and which changes a position of the constraint member with respect to the flexible plate;
   wherein when a first voltage is applied between the first electrode and the second electrode to generate an electrostatic force between the first electrode and the second electrode, the flexible plate is deflected toward the base member and the flexible plate is constrained by the base member so that the optical element is arranged at a second angle by the electrostatic force generated between the first electrode and the second electrode, and when a second voltage is applied between the first electrode and the third electrode to generate an electrostatic force between the first electrode and the third electrodes, the optical element or the flexible plate is constrained by the constraint member so that the optical element is arranged at a first angle by the electrostatic force generated between the first electrode and the third electrode.

36. The optical device according to claim 35, wherein the constraint member is displaced by the mechanism to a position at which the constraint member is brought in contact with the flexible plate.

37. The optical device according to claim 35, wherein the third electrode is provided on the constraint member; and the flexible plate is constrained by the constraint member so that the optical element is arranged to be parallel to the base member by the electrostatic force generated between the first electrode and the third electrode when the second voltage is applied between the first electrode and the third electrode.

* * * * *

UNITED STATES PATENT AND TRADEMARK OFFICE
CERTIFICATE OF CORRECTION

Page 1 of 1

PATENT NO.        : 8,699,116 B2
APPLICATION NO.   : 12/662719
DATED             : April 15, 2014
INVENTOR(S)       : Suzuki et al.

It is certified that error appears in the above-identified patent and that said Letters Patent is hereby corrected as shown below:

On the Title Page Item [56] (OTHER PUBLICATIONS), Col. 2, Line 3, delete "S467S-470." and insert -- S467-S470. --, therefor.

Signed and Sealed this
Twenty-second Day of July, 2014

Michelle K. Lee
*Deputy Director of the United States Patent and Trademark Office*